(12) United States Patent
Chen

(10) Patent No.: US 11,749,729 B2
(45) Date of Patent: Sep. 5, 2023

(54) SEMICONDUCTOR DEVICE, INTEGRATED CIRCUIT COMPONENT AND MANUFACTURING METHODS THEREOF

(71) Applicant: Taiwan Semiconductor Manufacturing Company, Ltd., Hsinchu (TW)

(72) Inventor: Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 120 days.

(21) Appl. No.: 17/218,176

(22) Filed: Mar. 31, 2021

(65) Prior Publication Data

US 2022/0320299 A1 Oct. 6, 2022

(51) Int. Cl.
| | |
|---|---|
| *H01L 29/417* | (2006.01) |
| *H01L 23/522* | (2006.01) |
| *H01L 27/06* | (2006.01) |
| *H01L 23/00* | (2006.01) |
| *H01L 21/822* | (2006.01) |
| *H01L 21/8234* | (2006.01) |
| *H01L 29/40* | (2006.01) |

(52) U.S. Cl.
CPC ...... *H01L 29/4175* (2013.01); *H01L 21/8221* (2013.01); *H01L 21/823418* (2013.01); *H01L 21/823475* (2013.01); *H01L 23/5226* (2013.01); *H01L 24/19* (2013.01); *H01L 24/24* (2013.01); *H01L 27/0688* (2013.01); *H01L 29/401* (2013.01); *H01L 2224/2413* (2013.01)

(58) Field of Classification Search
CPC ......... H01L 21/8221; H01L 21/823418; H01L 21/823475; H01L 23/5226; H01L 23/481; H01L 23/485; H01L 24/19; H01L 24/24; H01L 24/92; H01L 24/13; H01L 27/0688; H01L 29/401; H01L 29/4175
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |

(Continued)

*Primary Examiner* — Dao H Nguyen
(74) *Attorney, Agent, or Firm* — JCIPRNET

(57) ABSTRACT

A semiconductor device includes a gate structure, source/drain (S/D) elements, a first metallization contact and a second metallization contact. The S/D elements are respectively located at two different sides of the gate structure. The first metallization contact is located at and in contact with a first side of each of the S/D elements. The second metallization contact is located at and in contact with a second side of each of the S/D elements, where the semiconductor device is configured to receive a power signal through the second metallization contact. The first side is opposite to the second side along a stacking direction of the gate structure and the S/D elements, and the first side is closer to the gate structure than the second side is.

20 Claims, 22 Drawing Sheets

(56) References Cited

U.S. PATENT DOCUMENTS

| | | |
|---|---|---|
| 9,576,814 B2 | 2/2017 | Wu et al. |
| 11,482,548 B2 * | 10/2022 | Yokoyama ............ H01L 23/481 |
| 2010/0181547 A1 * | 7/2010 | Kuroda ............... H01L 27/2436 |
| | | 257/295 |
| 2012/0248544 A1 * | 10/2012 | Yokoyama .......... H01L 23/5226 |
| | | 438/455 |
| 2017/0243920 A1 * | 8/2017 | Yokoyama ............ H01L 21/845 |

* cited by examiner

SEMICONDUCTOR DEVICE, INTEGRATED CIRCUIT COMPONENT AND MANUFACTURING METHODS THEREOF

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging for ensuring the reliability of semiconductor packages. Semiconductor processing for fabrications of the semiconductor devices and ICs continues to evolve towards increasing device-density, higher numbers of active devices (mainly transistors) of ever decreasing device dimensions. The integration of a power delivery network with low power loss in the semiconductor devices and ICs has become particularly challenging because of the above named increase in the device density.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
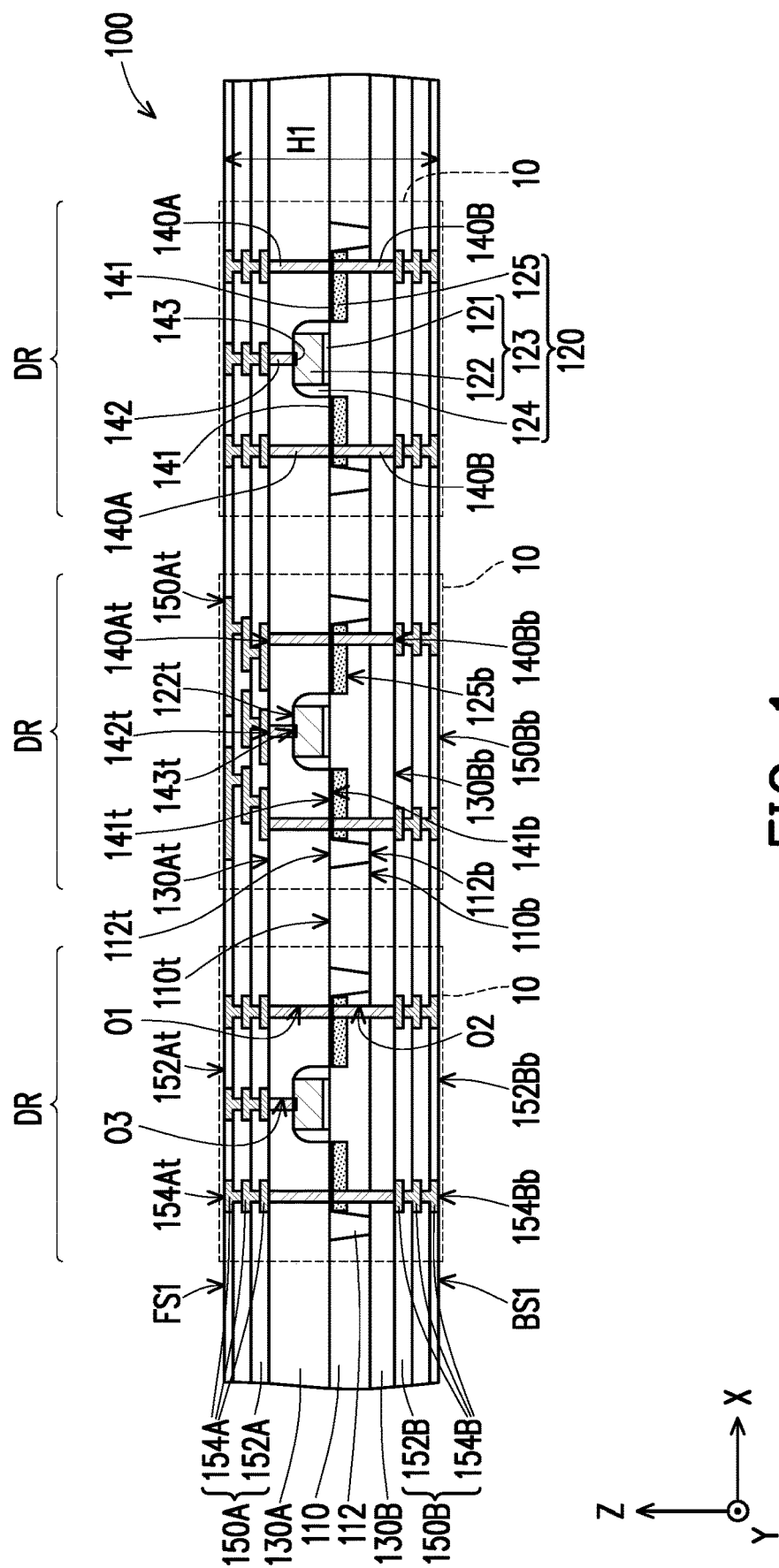
FIG. 1 through FIG. 7 are schematic cross-sectional views of various stages in a manufacturing method of an integrated circuit component in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Some embodiments of the disclosure describe the manufacturing process of one or more integrated circuit component having a transistor of a planar structure with a backside power rail involving no through-silicon-via (TSV) and the transistor fabricated therefrom. Besides, some embodiments of the disclosure further describe one or more integrated circuit component having a transistor of a fin structure with a backside power rail involving no TSV. In the disclosure, the transistors are referred to as semiconductor devices herein. The transistors may be formed on bulk silicon substrates in certain embodiments of the disclosure. Still, the transistors may be formed on a silicon-on-insulator (SOI) substrate as alternatives. The embodiments are not limited in this context. And, the embodiments are intended to provide further explanations but are not used to limit the scope of the disclosure.

Figure 6:
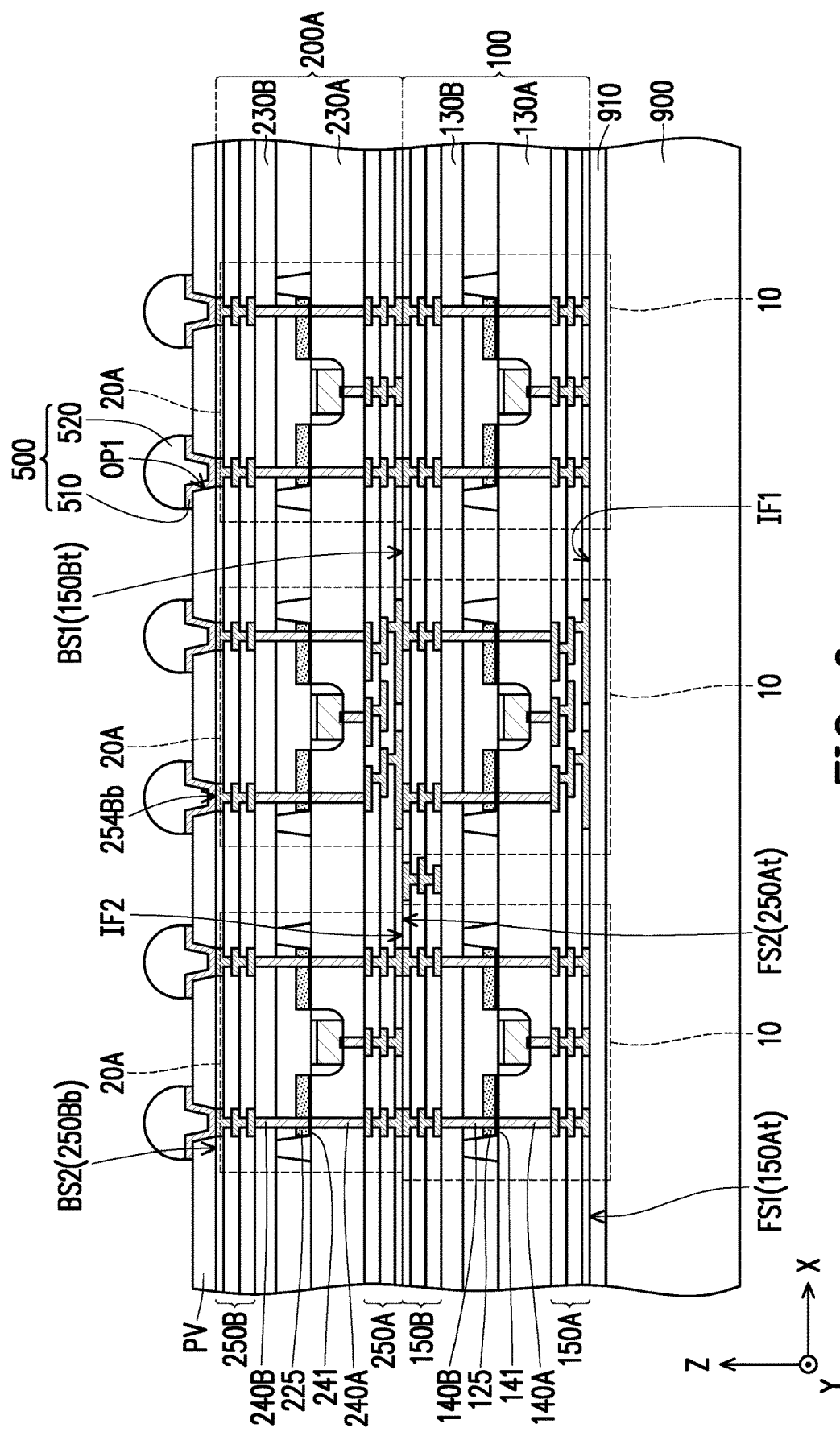
Figure 7:
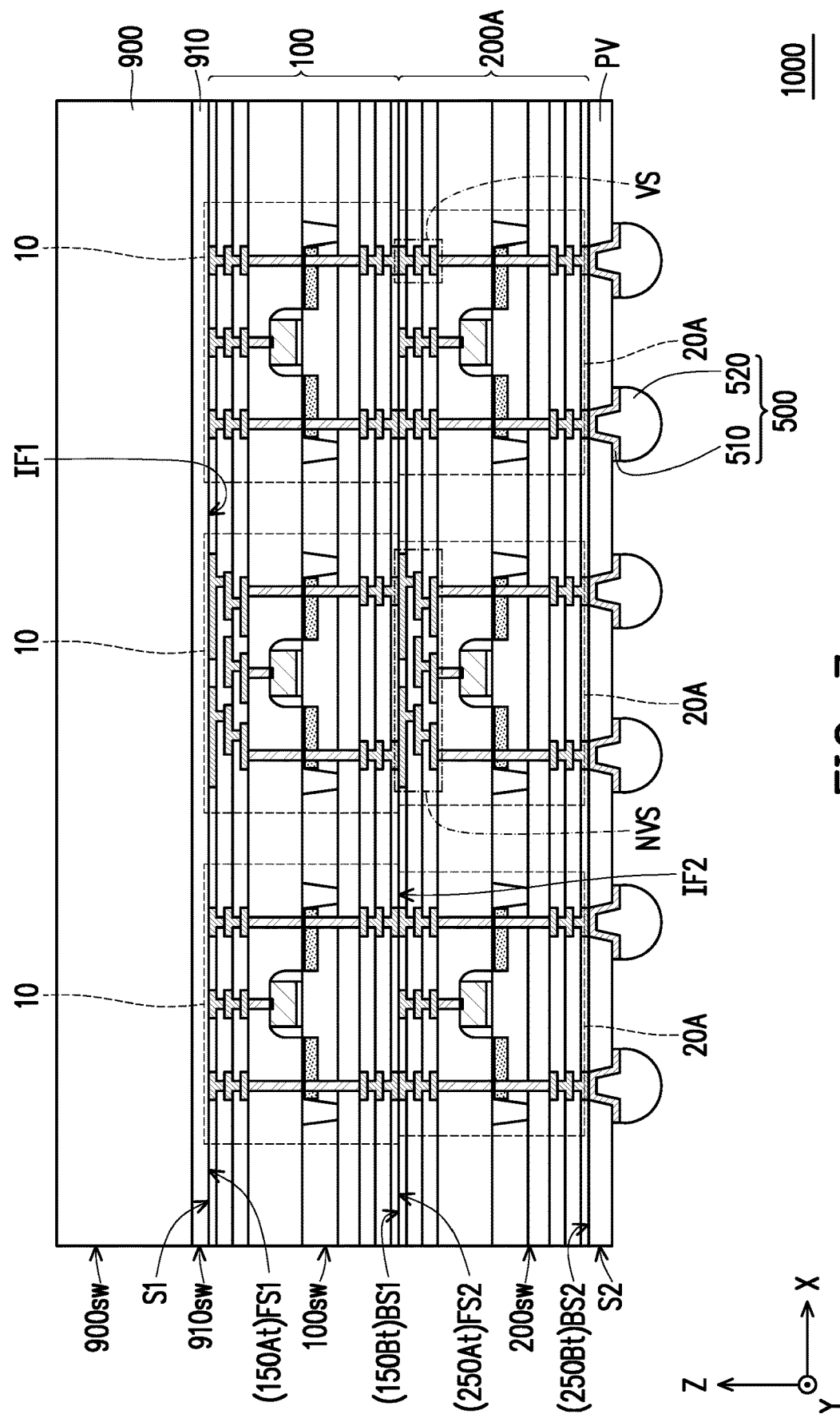
Figure 8:
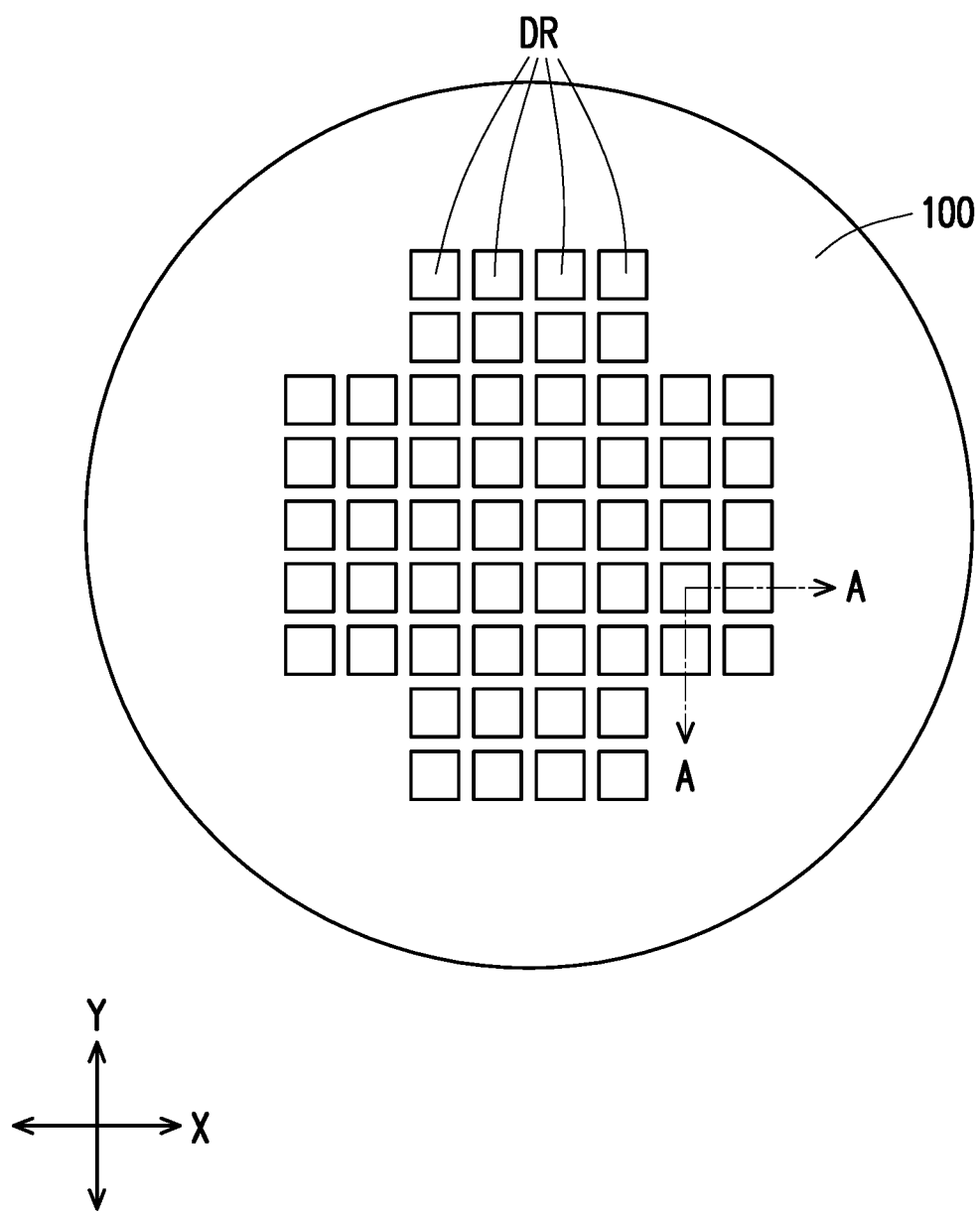
FIG. 8 is a schematic top view illustrating a layout of device regions for a semiconductor wafer in accordance with some embodiments of the disclosure.
Figure 9:
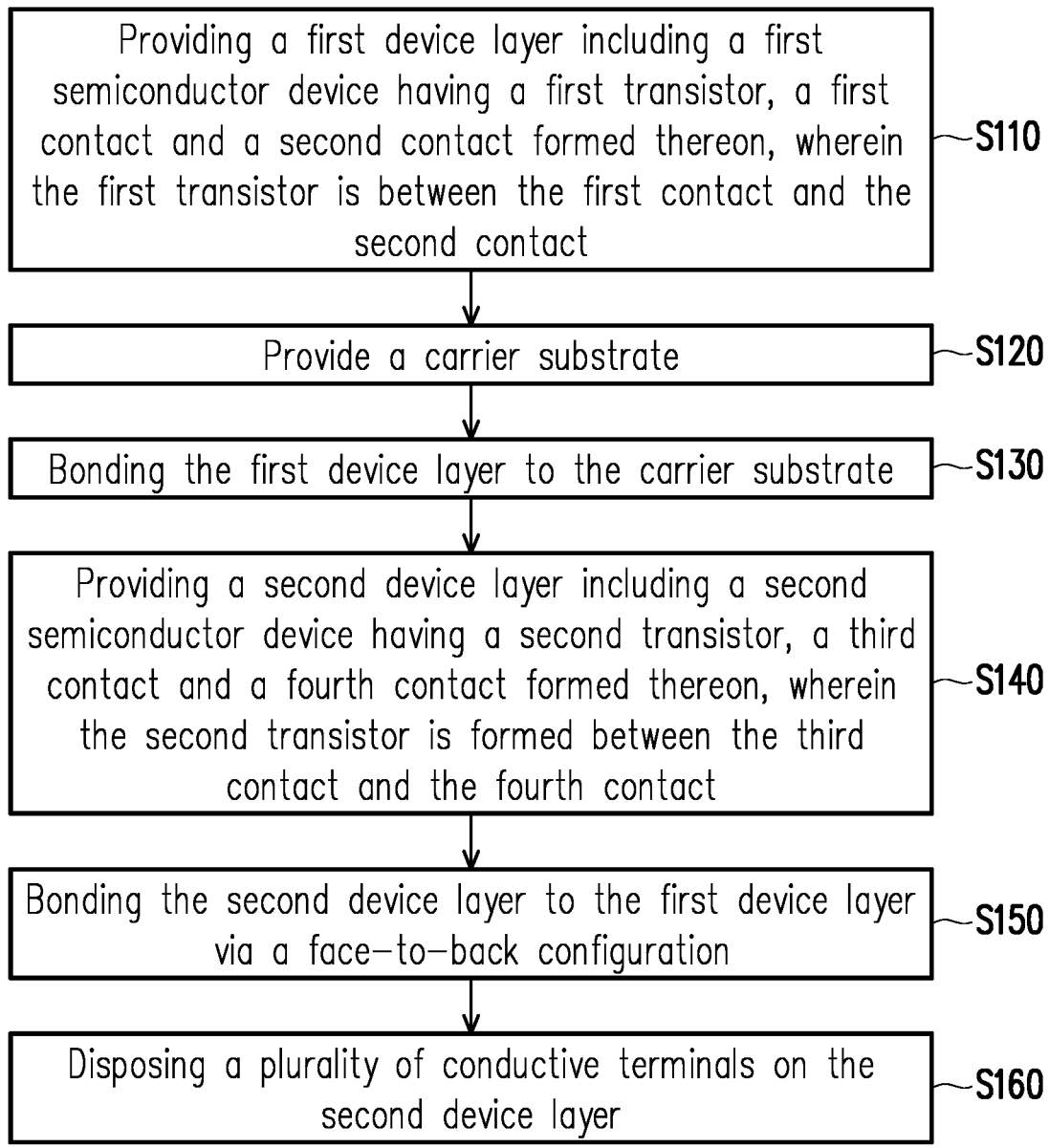
FIG. 9 is a flow chart illustrating a method of manufacturing an integrated circuit component in accordance with some embodiments of the disclosure.

FIG. 1 through FIG. 7 are schematic cross-sectional views of various stages in a manufacturing method of an integrated circuit component in accordance with some embodiments of the disclosure. FIG. 8 is a schematic top view illustrating a layout of device regions for a semiconductor wafer in accordance with some embodiments of the disclosure, where FIG. 1 through FIG. 7 are the schematic cross-sectional views taken along a line AA depicted in FIG. 8. FIG. 9 is a flow chart illustrating a method of manufacturing an integrated circuit component in accordance with some embodiments of the disclosure. In embodiments, the manufacturing method is part of a wafer level packaging process. It is to be noted that the process steps described herein cover a portion of the manufacturing processes used to fabricate a semiconductor component such as an integrated circuit component or a semiconductor package. The embodiments are intended to provide further explanations but are not used to limit the scope of the disclosure. In FIG. 1 to FIG. 7, multiple transistors are shown to represent plural transistors included in one of integrated circuit components of the wafer, and one integrated circuit component is shown to represent plural integrated circuit components obtained following the (semi-conductor) manufacturing method, however the disclosure is not limited thereto. In alternative embodiments, one or more transistors are shown to represent plural transistors obtained following the manufacturing method, or one or more integrated circuit components are shown to represent plural integrated circuit components obtained following the (semi-conductor) manufacturing method.

Referring to FIG. 1, in some embodiments, a wafer 100 including at least one semiconductor device is provided, in accordance with step S110 of FIG. 9. In some embodiments, the at least one semiconductor device includes one semiconductor device or multiple semiconductor devices. For example, the at least one semiconductor device includes a plurality of semiconductor devices 10, such as three semiconductor devices 10 as shown in FIG. 1, for illustrative purposes; the number of semiconductor devices 10 may be more than three, less than three or more than three. The at least one semiconductor device may include a single one semiconductor device 10.

In some embodiments, in a top view (e.g., a X-Y plane) of the wafer 100, the wafer 100 is divided into a plurality of device regions DR, where the semiconductor devices 10 are formed in the device regions DR, respectively. In other words, one device region DR has one semiconductor device 10, for example. The number of the device regions DR is not limited thereto, and may be designated based on the demand and design layout. The device regions DR may be arranged aside to each other along a direction X and/or a direction Y. The direction X and the direction Y are not the same to each other. For example, the direction X and the direction Y are perpendicular to each other. For example, a top view (e.g., a X-Y plane) depicted in FIG. 8 of the wafer 100, the device regions DR are arranged in the form of a matrix, such as a N×N array or a N×M array (N, M>0, N may or may not be equal to M). In other words, the number of the device regions DR corresponds to the number of the semiconductor device 10. Before performing a wafer sawing or dicing process on the wafer 100, the semiconductor devices 10 of the wafer W1 are connected one another, as shown in FIG. 1, for example.

In some embodiments, the wafer 100 includes a semiconductor substrate 110, a plurality of isolation regions 112, a plurality of transistors 120, inter-level dielectric (ILD) layers 130A and 130B, a plurality of metals contacts 140A, 140B, 142, and interconnects 150A and 150B. For example, the isolation regions 112 are located inside the semiconductor substrate 110, the transistors 120 are located on and further extended into the semiconductor substrate 110, the ILD layers 130A and 130B are located at two different sides of the semiconductor substrate 110, the metals contacts 140A, 142 penetrate through the ILD layer 130A and electrically connect to the transistors 120, the metals contacts 140B penetrate through the ILD layer 130B and electrically connect to the transistors 120, the interconnect 150A is located on the ILD layer 130A and electrically connects to the transistors 120 through the metal contacts 140A and 142, and the interconnect 150B is located on the ILD layer 130B and electrically connects to the transistors 120 through the metal contacts 140B. In such example, the ILD layer 130A is located between the interconnect 150A and the semiconductor substrate 110, and the ILD layer 130B is located between the interconnect 150B and the semiconductor substrate 110. In some embodiments, along a direction Z, an overall thickness H1 of the wafer 100 is approximately ranging from 2 µm to 20 µm. The direction Z is different from the direction X and the direction Y. For example, the direction Z is perpendicular to the direction X and the direction Y.

In some embodiments, the wafer 100 further includes silicide layers 141 and 143 between the transistors 120 and the ILD layer 130A. For example, as shown in FIG. 1, the silicide layers 141 each are located at a surface (e.g. of source/drain (S/D) portions) of the transistors 120. Owing to the silicide layers 141, the resistances between the metal contacts 140A and the transistors 120 and between the metal contacts 140B and the transistors 120 are reduced, thereby facilitating the electrical connections between the metal contacts 140A, 140B and the transistors 120 (e.g. the S/D portions). On the other hands, for example, the silicide layers 143 each are located at a surface (e.g. of a gate electrode) of the transistors 120. Owing to the silicide layers 143, the resistances between the metal contacts 142 and the transistors 120 are reduced, thereby facilitating the electrical connections between the metal contacts 142 and the transistors 120 (e.g. the gate electrode).

The semiconductor substrate 110 may be a planar substrate or a bulk substrate. For example, a material of the semiconductor substrate 110 includes silicon, an alloy semiconductor such as silicon germanium, silicon germanium carbide, gallium arsenic phosphide, or gallium indium phosphide, or other semiconductor materials. For another example, the semiconductor substrate 110 includes a semiconductor on insulator such as SOI or silicon on sapphire. Alternatively or additionally, the semiconductor substrate 110 may include other elementary semiconductor materials such as germanium, gallium arsenic, or other suitable semiconductor materials. In some embodiments, the semiconductor substrate 110 further includes other features such as various doped regions, a buried layer, and/or an epitaxy layer. For instances, the semiconductor substrate 110 may include various doped regions (not shown) depending on design requirements (e.g., p-type wells or n-type wells). The doped regions are doped with p-type dopants, such as boron or $BF_2$, and/or n-type dopants, such as phosphorus or arsenic. Moreover, the doped regions may be formed directly on the semiconductor substrate 110, in a P-well structure, in an N-well structure, in a dual-well structure, or using a raised structure. As shown in FIG. 1, the semiconductor substrate 110 has a surface 110t and a surface 110b opposite to the surface 110t along the direction Z.

In some embodiments, the isolation regions 112 are formed inside the semiconductor substrate 110 to isolate the transistors 120 respectively in the device regions DR. The isolation regions 112 utilize isolation technology, such as local oxidation of silicon (LOCOS) or shallow trench isolation (STI) to electrically isolate various regions. If the isolation regions are made of STIs, the STI regions include silicon oxide, silicon nitride, silicon oxynitride, other suitable materials, or a combination thereof. In some examples, the filled trenches in the STI regions each have a multi-layer structure such as a thermal oxide liner layer filled with silicon nitride or silicon oxide. As shown in FIG. 1, the isolation regions 112 each have a surface 112t and a surface 112b opposite to the surface 112t along the direction Z. In some embodiments, the surfaces 112t of the isolation regions 112 are substantially levelled with and coplanar to the surface 110t of the semiconductor substrate 110. In some embodiments, the surfaces 112b of the isolation regions 112 are substantially levelled with and coplanar to the surface 110b of the semiconductor substrate 110. However, the disclosure is not limited thereto; alternatively, the surfaces 112b of the isolation regions 112 may be not be accessibly revealed by the surface 110b of the semiconductor substrate 110, that the surfaces 112b of the isolation regions 112 may be the embedded inside the semiconductor substrate 110.

As illustrated in FIG. 1, in some embodiments, the transistors 120 each includes a gate structure 123 over the surface 110t of the semiconductor substrate 110, a pair of spacers 124 located on the surface 110t of the semiconductor substrate 110 at two opposite sides of the gate structure 123, and S/D portions 125 embedded in the semiconductor substrate 110 and located at two opposite sides of the gate structure 123. In some embodiments, for each of the transistors 120, one the spacers 123 is between the gate electrode 122 and one the S/D portions 125, and other one the spacers 123 is between the gate electrode 122 and other one the S/D portions 125.

In some embodiments, the gate structure 123 includes a gate dielectric layer 121 and a gate electrode 122, where the gate dielectric layer 121 is located between the gate electrode 122 and the semiconductor substrate 110. For example, the gate dielectric layer 121 and the gate electrode 122 are formed over the semiconductor substrate 110 in sequential order from bottom to top. The gate dielectric layer 121 includes silicon oxide, silicon nitride, silicon oxy-nitride, high-k dielectric materials, or a combination thereof. It should be noted that the high-k dielectric materials are generally dielectric materials having a dielectric constant greater than 4 or even greater than about 10. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. In some embodiments, the gate dielectric layer 121 is a high-k dielectric layer with a thickness in the range of about 10 to 30 angstroms. The gate dielectric layer 121 is formed using a suitable process such as atomic layer deposition (ALD), chemical vapor deposition (CVD) such as flowable chemical vapor deposition (FCVD), physical vapor deposition (PVD), thermal oxidation, UV-ozone oxidation, or a combination thereof.

In some embodiments, the gate electrode 122 includes a single-layered structure or a multi-layered structure. In some embodiments, the gate electrode 122 includes semiconductor material. For example, the gate electrode 122 may be made of undoped or doped polysilicon, amorphous silicon, or a combination thereof. In some alternative embodiments, the gate electrode 122 is a metal gate including metal, metal alloy, metal silicide or a combination thereof, the disclosure is not limited thereto. The gate electrode 122 may be formed by using a suitable process such as ALD, CVD, PVD, plating, or a combination thereof.

In some embodiments, the spacers 124 are formed over sidewalls of the gate electrode 122. The spacers 124 are formed of silicon oxide, silicon nitride, silicon oxynitride, silicon carbide, fluoride-doped silicate glass (FSG), low-k dielectric materials, or a combination thereof. It should be noted that the low-k dielectric materials are generally dielectric materials having a dielectric constant lower than 3.9. The spacers 124 may have a multi-layer structure which includes one or more liner layers. The liner layer includes a dielectric material such as silicon oxide, silicon nitride, and/or other suitable materials. The formation of the spacers 124 can be achieved by depositing suitable dielectric material and anisotropically etching off the dielectric material. In certain embodiments, the spacers 124 are further formed over sidewalls of the gate dielectric layer 121. In other words, the spacers 124 are formed on the surface 110t of the semiconductor substrate 100 and extend over sidewalls of the gate structure 120, as shown in FIG. 1. for example.

In some embodiments, the S/D portions 125 are formed on opposite sides of the gate dielectric layer 121 and the gate electrode 122. In some embodiments, the S/D portions are at least partially embedded inside the semiconductor substrate 100. The S/D portions may further laterally extend (along the directions X and/or Y) in semiconductor substrate 110 to be partially located underneath part of the spacers 124. For example, in each device region DR, the pair of the S/D portions 125 may be formed by a doping process, an epitaxy growth process, or a combination thereof.

In some embodiments, the S/D portions 125 are formed by doping the semiconductor substrate 110 with a p-type dopants or an n-type dopants. The S/D portions 125 of the semiconductor device 10 may include p-type dopants, where based on the dopant type, the semiconductor device 10 may be referred to as a P-type metal oxide semiconductor (PMOS) device. On the other hand, the S/D portions 125 of the semiconductor device 10 may include n-type dopants, where based on the dopant type, the semiconductor device 10 may be referred to as a N-type metal oxide semiconductor (NMOS) device. Alternatively, the semiconductor device 10 may include a complementary metal oxide semiconductor (CMOS) device including a NMOS device and a PMOS device electrically coupled to each other.

In some embodiments, dopants are doped into the S/D portions 125 through ion implantation. Through the ion implantation, the S/D portions 125 are referred to as S/D (doping) regions, which are completely embedded in the semiconductor substrate 110, for example, as shown in FIG. 1.

In the embodiments of the S/D portions 125 are formed by formed by the doping process, the S/D portions 125 each includes a top surface (not labeled) in contact with (a surface 141b of) one silicide layer 141 and a surface 125b embedded inside the semiconductor substrate 110. In such embodiments, the silicide layers 141 are electrically connected to the S/D portions 125 by (physically) direct contact, where a surface 141t of each of the silicide layers 141 is substantially levelled with and coplanar to the surface 110t of the semiconductor substrate 110, and a surface 141b of each of the silicide layers 141 is substantially located at the top surface of each of the S/D portions 125. In some embodiments, the metal contacts 140A are electrically coupled to the S/D portions 125 through connecting the silicide layers 141 (e.g. the surfaces 141t), and the metal contacts 140B are electrically coupled to the S/D portions 125 through connecting the silicide layers 141 (e.g. the surfaces 141b) by penetrating the S/D portions 125 and passing through a part of the semiconductor substrate 110 underneath the S/D portions 125, as illustrated in FIG. 1.

Alternatively, in some embodiments, part of the semiconductor substrate 110 is removed through etching or other suitable processes and the dopants are formed in the hollowed area through epitaxy growth. In some embodiments, the epitaxial layers include SiGe, SiC, or other suitable materials. The doping process and the epitaxy growth process may be performed in an in-situ manner to form the S/D portions 125. In some embodiments, a materials of the S/D portions 125 includes SiGeB, which is formed by a strained material such as SiGe being epitaxial-grown by low-pressure chemical vapor deposition (LPCVD) process with in-situ doping with a p-type dopant for obtaining a semiconductor device of PMOS. In some embodiments, a material of the S/D portions 125 includes SiP, which is formed by a strained material such as SiC being epitaxial-grown by LPCVD process with in-situ doping with a n-type dopant for obtaining a semiconductor device of NMOS. In a further alternative, the doping process may be performed after the epitaxy growth process to form the S/D portions 125. In a yet further alternative, the doping process may not be performed after the epitaxy growth process to form the S/D portions 125. Through the epitaxy growth process (not shown), the S/D portions 125 are referred to as S/D (strained) elements, which are completely or partially embedded in the semiconductor substrate 110 depending on the demand or design requirement, for example. The S/D portions 125 may be grown to have substantially identical size. For example, the S/D portions 125 are symmetrical to one another. However, the disclosure is not limited thereto. Alternatively, the S/D portions 125 may be grown to have different sizes.

In the embodiments of the S/D portions 125 are formed by formed by the epitaxy growth process, the S/D portions 125 each includes a top surface in contact with one silicide layer 141 and a bottom surface in contact with another silicide layer 141. In such embodiments, the silicide layers 141 are electrically connected to the S/D portions 125 by (physically) direct contact, where the metal contacts 140A are electrically coupled to the S/D portions 125 through connecting the silicide layers 141 located at the top surfaces thereof, and the metal contacts 140B are electrically coupled to the S/D portions 125 through connecting the silicide layers 141 located at the bottom surfaces thereof. In other words, for one transistor 120 of such embodiments, the pair of the S/D portions 125 each have its top surface and bottom surface exposed by the semiconductor substrate 110 for forming the silicide layers 141 thereon, where the metal contacts 140A and 140B are respectively connected to the silicide layers 141 respectively located at the top surface and bottom surface of each of the S/D portions 125.

On the other hands, for each transistor 120, the silicide layer 143 is located at a surfaces 122t of the gate electrodes 122, in some embodiments. As shown in FIG. 1, the metal contact 142 is electrically coupled to the gate electrode 122 through connecting the silicide layer 143, for example. Owing to such configuration, the metal contact 140A may be referred to as frontside S/D (metal) contacts, the metal contact 140B may be referred to as backside S/D (metal) contacts for transmitting the power signal to the transistors 120 from an external device (e.g., a power source), and the metal contact 142 may be referred to as a gate (metal) contact.

In some embodiments, the silicide layers 141 and 143 are formed through a silicification treatment. In some embodiments, the silicide layers 141 and 143 include metal silicide. In one embodiment, the silicide layers 141 and 143 are formed in a same step. In an alternative embodiment, the silicide layers 141 and 143 are formed in different steps. The materials of the silicide layers 141 and 143 may be the same or different.

As illustrated in FIG. 1, for example, the ILD layers 130A and 130B are formed over the semiconductor substrate 110 to cover the transistors 120. In some embodiments, the ILD layer 130A is located over the surface 110t of the semiconductor layer 110, and the ILD layer 130B is located over the surface 110b of the semiconductor layer 110. For example, as shown in FIG. 1, a surface 130At of the ILD layer 130A and a surface 130Bb of the ILD 130B are substantially flat and planar surfaces, which facilitate the formation of later-formed elements, such as the interconnects 150A and 150B. The surface 130At of the ILD layer 130A and the surface 130Bb of the ILD 130B may be planarized by mechanical grinding, chemical mechanical polish (CMP) process, etching process or combinations thereof, the disclosure is not limited thereto. As shown in FIG. 1, for example, the ILD layer 130A fills up the gaps between the spacers 124 and completely covers the transistors 120 over the surface 110t of the semiconductor substrate 110, and the ILD layer 130B completely covers the surface 110b of the semiconductor substrate 110.

In some embodiments, the ILD layers 130A and 130B include silicon oxide, silicon nitride, silicon oxynitride, silicon carbonitride, silicon carbide oxynitride, SOG, phosphosilicate glass (PSG), borophosphosilicate glass (BPSG), fluorinated silica glass (FSG), carbon doped silicon oxide (e.g., SiCOH), polyimide, and/or a combination thereof. Alternatively, the ILD layers 130A and 130B may include low-K dielectric materials. Examples of low-K dielectric materials include BLACK DIAMOND® (Applied Materials of Santa Clara, Calif.), Xerogel, Aerogel, amorphous fluorinated carbon, Parylene, bis-benzocyclobutenes, Flare, SILK® (Dow Chemical, Midland, Mich.), hydrogen silsesquioxane (HSQ) or fluorinated silicon oxide (SiOF), and/or a combination thereof. It is understood that the ILD layers 130A and 130B may include one or more dielectric materials. In one embodiment, the ILD layers 130A and 130B independently have a single-layered structure or a multi-layered structure. In some embodiments, the ILD layers 130A and 130B are formed to a suitable thickness by CVD (e.g., Flowable CVD (FCVD), high density plasma chemical vapor deposition (HDPCVD) and sub-atmospheric pressure chemical vapor deposition (SACVD)), spin-on, sputtering, or other suitable methods. In one embodiment, the ILD layers 130A and 130B are formed in a same step. In an alternative embodiment, the ILD layers 130A and 130B are formed in different steps. The materials of the ILD layers 130A and 130B may be the same or different. Owing to the ILD layers 130A and 130B, the semiconductor substrate 110 and the transistors 120 are protected from damages caused by the fabrications of later-formed elements, such as the metals contacts 140A, 140B, 142 and the interconnects 150A, 150B.

Thereafter, a plurality of contact openings O1 and O3 are formed in the ILD layer 130A, and a plurality of contact openings O2 are formed in the ILD layer 130B, a portion of the semiconductor substrate 110 underneath the S/D portions 125 and the S/D portions 125, in some embodiments. The contact openings O1 and O3 may respectively expose at least a part of the silicide layers 141 and a part of the silicide layers 143 by penetrating through the ILD layer 130A. On the other hand, the contact openings O2 may expose at least a part of the silicide layers 141 by penetrating through the ILD layer 130B, the portion of the semiconductor substrate 110 underneath the S/D portions 125 and the S/D portions 125. In other words, as shown in FIG. 1, for example, the contact openings O1 accessibly reveal (the surfaces 141t of) the silicide layers 141, the contact openings O2 accessibly reveal (the surfaces 141b of) the silicide layers 141, and the contact openings O3 accessibly reveal the silicide layers 143, for further electrical connections with later-formed elements (e.g. the metal contacts 140A, 140B, 142). Alternatively, the contact openings O1, O2 and O3 may completely expose the silicide layers 141 and 143.

The contact openings O1, O2 and O3 may be formed through photolithography and etching processes. In one embodiment, the contact openings O1, O2 and O3 each have a vertical sidewall; however, the disclosure is not limited thereto. In an alternative embodiment, the contact openings O1, O2 and O3 each have a slant sidewall.

In some embodiments, the metal contacts 140A are formed in the contact openings O1 and connected to the silicide layers 141, the metal contacts 140B are located in the contact openings O2 and connected to the silicide layers 141, and the metal contacts 142 are formed in the contact openings O3 and connected to the silicide layers 143. Owing to such configuration, the metal contacts 140A and 140B are electrically coupled to the transistors 120 through the silicide layers 141 and the S/D regions 125, and the metal contacts 142 are electrically coupled to the transistors 120 through the silicide layers 143 and the gate structures 123.

In some embodiments, the metal contacts 140A and 142 are formed by, but not limited to, forming a conductive material over the surface 130At of the ILD layer 130A and in the contact openings O1 and O3, and removing the excessive conductive material on the surface 130At of the ILD layer 130A. In some embodiments, the metal contacts 140B are formed by, but not limited to, forming a conductive material over the surface 130Bb of the ILD layer 130B and in the contact openings O2, and removing the excessive conductive material on the surface 130Bb of the ILD layer 130B. In some embodiments, the conductive materials include copper, copper alloys, nickel, aluminum, manganese, magnesium, silver, gold, tungsten, a combination of thereof or the like. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The conductive materials may be formed by, for example, electro-chemical plating process, CVD (such as plasma-enhanced chemical vapor deposition (PECVD)), ALD, PVD, a combination thereof, or the like. The removing process may be achieved by mechanical grinding, CMP process, etching process or combinations thereof, for example.

The materials of the metal contacts 140A, 142 may be the same as the material of the metal contacts 140B. Alternatively, the materials of the metal contacts 140A, 142 may be different from the material of the metal contacts 140B. For example, as shown in FIG. 1, surfaces 140At of the metal contacts 140A and surfaces 142At of the metal contacts 142 are substantially levelled with and coplanar to the surface 130At of the ILD layer 130A, and surfaces 140Bb of the metal contacts 140B are substantially levelled with and coplanar to the surface 130Bb of the ILD layer 130B.

As illustrated in FIG. 1, for example, the interconnect 150A is formed on the surface 130At of the ILD layer 130A, the surfaces 140At of the metal contacts 140A and the surfaces 142At of the metal contacts 142, and the interconnect 150B is formed on the ILD layer the surface 130Bb of the ILD layer 130B and the surfaces 140Bb of the metal contacts 140B. In some embodiments, the interconnect 150A is electrically connected to the metal contacts 140A, 142, and the interconnect 150B is electrically connected to the metal contacts 140B.

In some embodiments, the interconnect 150A includes one or more dielectric layers 152A and one or more metallization patterns 154A in alternation. The metallization patterns 154A may be embedded in the dielectric layers 152A. In some embodiments, the interconnect 150A is electrically coupled to the transistors 120 through the metal contacts 140A and 142 for routing signals (e.g. electrical signals, power signals, and/or ground signals) thereto/therefrom. The uppermost layer of the interconnect 150A may be a passivation layer made of one or more suitable dielectric materials such as silicon oxide, silicon nitride, low-k dielectrics, polyimide, combinations of these, or the like. In some embodiments, as shown in FIG. 1, the passivation layer (e.g. the uppermost layer of the dielectric layers 152A) of the interconnect 150A has openings exposing portions of a topmost layer of the metallization patterns 154A for further electrical connection. For example, at a surface 150At of the interconnect 150A, a surface 152At of the uppermost layer of the dielectric layers 152A is substantially coplanar to a surface 154At of the uppermost layer of the metallization patterns 154A exposed therefrom.

In some embodiments, the interconnect 150B includes one or more dielectric layers 152B and one or more metallization patterns 154B in alternation. The metallization patterns 154B may be embedded in the dielectric layers 152B. In some embodiments, the interconnect 150B is electrically coupled to the transistors 120 through the metal contacts 140B for routing signals (e.g. electrical signals, power signals, and/or ground signals) thereto/therefrom. The bottommost layer of the interconnect 150B may be a passivation layer made of one or more suitable dielectric materials such as silicon oxide, silicon nitride, low-k dielectrics, polyimide, combinations of these, or the like. In some embodiments, as shown in FIG. 1, the passivation layer (e.g. the bottommost layer of the dielectric layers 152B) of the interconnect 150B has openings exposing portions of a bottommost layer of the metallization patterns 154B for further electrical connection. For example, at a surface 150Bb of the interconnect 150A, a surface 152Bb of the bottommost layer of the dielectric layers 152B is substantially coplanar to a surface 154Bb of the bottommost layer of the metallization patterns 154A exposed therefrom.

The dielectric layers 152A, 152B may be polyimide (PI), polybenzoxazole (PBO), benzocyclobutene (BCB), a nitride such as silicon nitride, an oxide such as silicon oxide, PSG, borosilicate glass (BSG), BPSG, a combination thereof or the like, which may be patterned using a photolithography and/or etching process. In some embodiments, the dielectric layers 152A, 152B are formed by suitable fabrication techniques such as spin-on coating, CVD (e.g. PECVD) or the like.

The metallization patterns 154A, 154B may be made of conductive materials formed by electroplating or deposition, such as copper, copper alloy, aluminum, aluminum alloy, or combinations thereof, which may be patterned using a photolithography and etching process. In some embodiments, the metallization patterns 154A, 154B are patterned copper layers or other suitable patterned metal layers. For example, may be metal lines, metal vias, metal pads, metal traces, etc. The numbers of the dielectric layers 152A, 152B and the number of the metallization patterns 154A, 154B are not limited in the disclosure, and may be selected and designated based on demand and design layout.

The transistors 120 and the interconnects 150A, 150B are interconnected (through the metal contacts 140A, 140B, 142) to perform one or more functions including memory structures (e.g., a memory cell), processing structures (e.g., a logic cell), input/output (I/O) circuitry (e.g. an I/O cell), or the like. The surface 150At of the interconnect 150A is referred to as a front-side surface FS1 of the wafer 100, and the surface 150Bb of the interconnect 150B is referred to as a back-side surface BS1 of the wafer 100, for example. As illustrated shown in FIG. 1, the semiconductor devices 10 included in the wafer 100 each include the semiconductor substrate 110, one transistor 120, the silicide layers 141, 143, the ILD layers 130A, 130B, the metal contacts 140A, 140B, 142, and the interconnects 150A, 150B, for example. In the disclosure, for example, the metal contacts 140B and the interconnect 150B are together serve as a backside power rail of a respective transistor 120 in one semiconductor device 10. In some embodiments, as shown in FIG. 7, the backside power rail including the metal contacts 140B and the interconnect 150B is physically separated from the interconnect 150A. In other words, the backside power rail including the metal contacts 140B and the interconnect 150B is free from the interconnect 150A and the metal contact 140A.

It is appreciated that the number of the transistors 120 included in one semiconductor device 10 and the number of the semiconductor devices 10 (or saying the device regions DR) included in the wafer 100 are not limited in the disclosure, and each may be one or more than one. For example, there are one or more transistors 120 in one semiconductor device 10, and/or there are one or more semiconductor devices 10 in one wafer 100. In some embodiments, the fabrications of the isolation regions 112 and the transistors 120 over the semiconductor substrate 110 are formed in a front-end-of-line (FEOL) process. On the other hands, in some embodiments, the fabrications of the ILD layers 130A, 130B, the silicide layers 141, 143, the metals contacts 140A, 140B, 142 and the interconnects 150A, 150B are formed in a back end of line (BEOL) process.

In some alternative embodiments, the wafer 100 further includes an etch stop layer (not shown) conformally formed on the transistors 120 and over the surface 110t the semiconductor substrate 110, where the etch stop layer is located between the ILD layer 130A and the semiconductor substrate 110 and between the ILD layer 130A and the transistors 120. The etch stop layer may cover at least a part of the transistors 120 exposed by the silicide layers 141 and 143 and the semiconductor substrate 110. For example, the etch stop layer completely exposes the silicide layer 141 and 143 for connecting the metal contacts 140A and 142. Owing to the etch stop layer, the semiconductor substrate 110 and the transistors 120 are protected from damages caused by the fabrications of later-formed elements, such as the ILD layer 130A, the metals contacts 140A and 142, and the interconnects 150A. In some alternative embodiments, the etch stop layer is also formed in a back end of line (BEOL) process.

The etch stop layer may be referred to as a contact etch stop layer (CESL). In some embodiments, the etch stop layer includes commonly used dielectric materials, such as silicon nitride, silicon oxynitride, silicon oxycarbide, silicon carbide, combinations thereof, and multi-layers thereof. Besides stopping an etching process, the etch stop layer may also apply a stress to the channel regions of the transistors 120. For example, a portion of the etch stop layer, which is in a device region DR for a n-type transistor, has a tensile stress, while a portion of the etch stop layer, which is in a device region DR for a p-type transistor, has a compressive stress.

Figure 2:
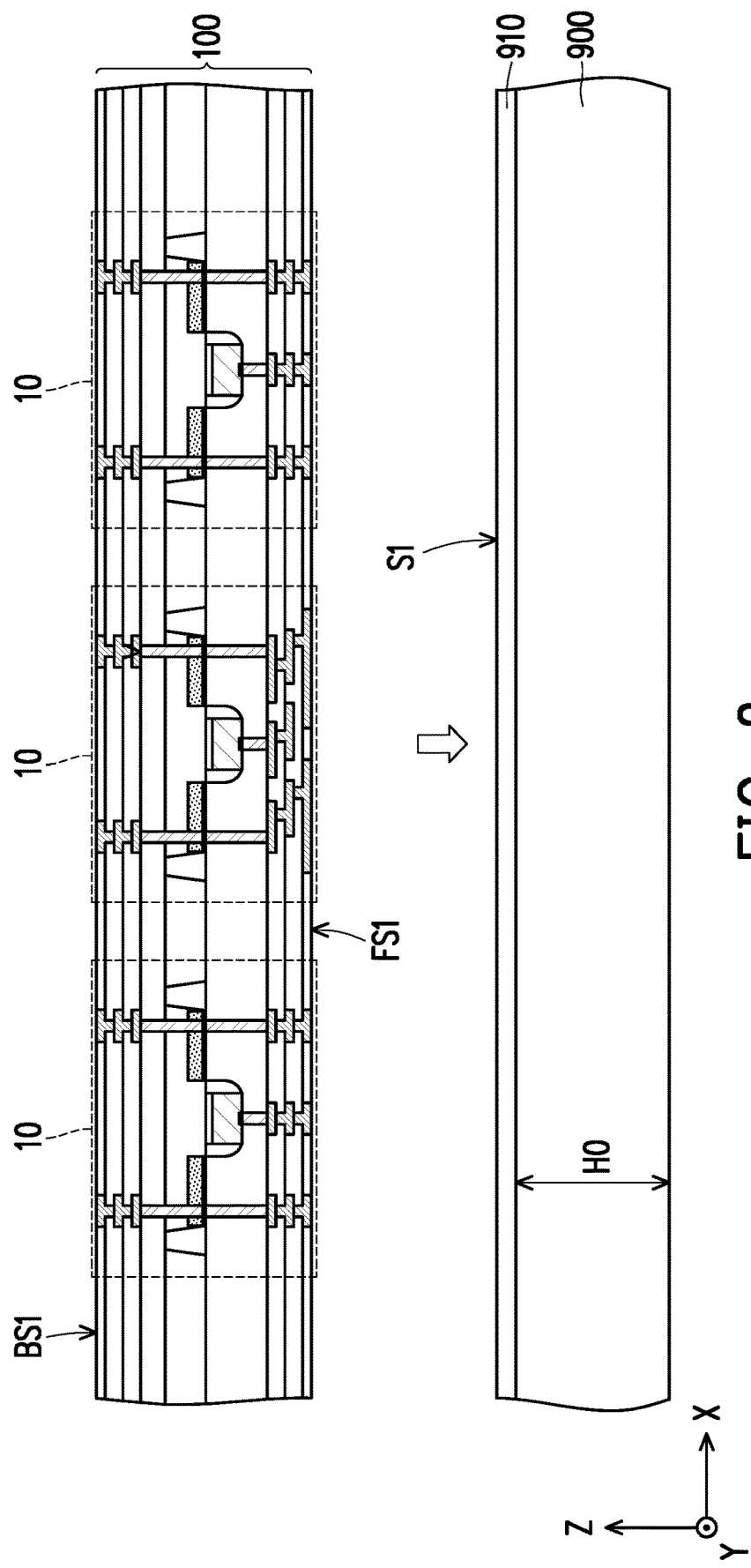

Referring to FIG. 2, in some embodiments, a carrier substrate 900 coated with a bonding layer 910 thereon is provided, in accordance with step S120 of FIG. 9. In some embodiments, the bonding layer 910 is formed on the carrier substrate 900, and the wafer 100 is placed over a side of the carrier substrate 900 where the bonding layer 910 located at, where the front-side surface FS1 of the wafer 100 faces to a surface S1 of the bonding layer 910. In some embodiments, the carrier substrate 900 includes a silicon-based layer (such as a silicon substrate or a silicon oxide layer), a ceramics layer, a polymer layer, a compound layer, or a layer made of any suitable other material. In one embodiment, the carrier substrate 900 includes a reclaim wafer or a reconstituted wafer. For example, as the material of the carrier substrate 900 is a Si substrate, the carrier substrate 900 serves as a heat dissipating element for the semiconductor devices 10 included in the wafer 100. The carrier substrate 900 may further be used for warpage control of an integrated circuit component (e.g. 1000 depicted in FIG. 7). In some embodiments, along the direction Z, an overall thickness H0 of the carrier substrate 900 is approximately ranging from 50 µm to 800 µm, such as 770 µm.

In some embodiments, the bonding layer 910 is a smooth layer having a continuous even surface and overlaid on an illustrated top surface (not labeled) of the carrier substrate 900. For example, the bonding layer 910 is formed in a form of a blanket layer entirely covering the carrier substrate 900. In some embodiments, a material of the bonding layer 910 is made of silicon oxynitride, and may be formed by deposition or the like. In an alternative embodiment, the material of the bonding layer 910 is made of silicon oxide, silicon nitride or the like. Due to the illustrated top surface of the carrier substrate 900 has the high degree of planarity and flatness, the bonding layer 910 is capable of having a substantially uniform and even thickness, for example.

Figure 3:
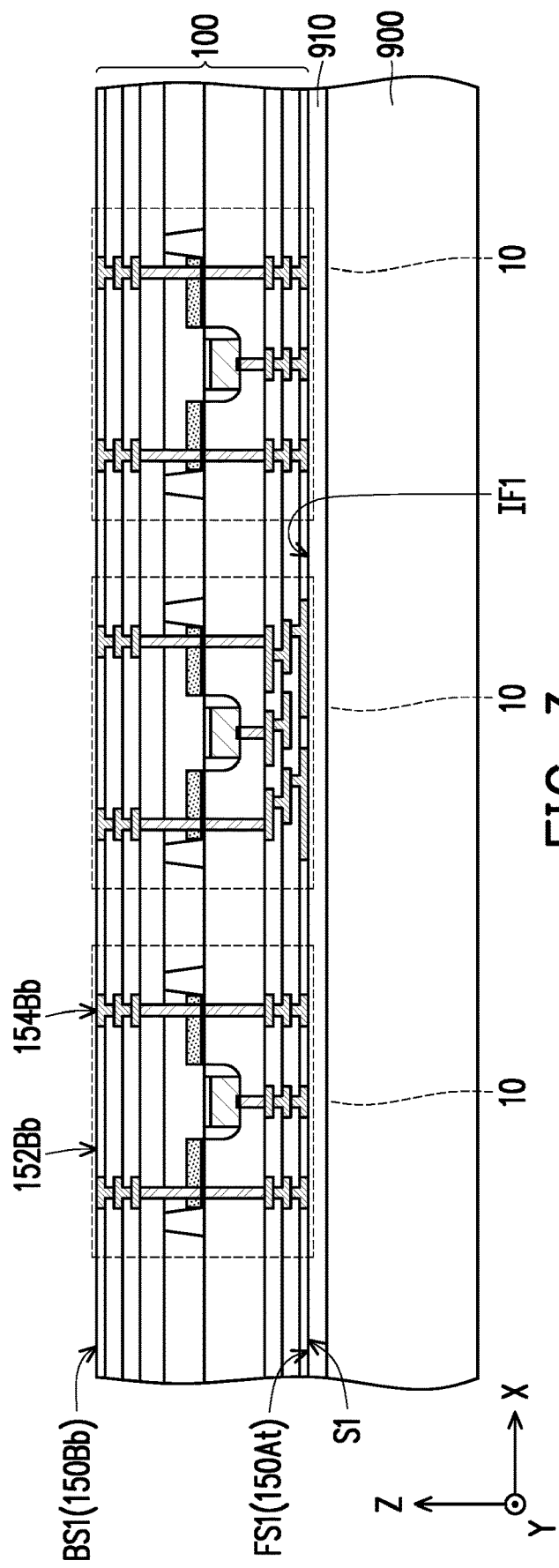

Referring to FIG. 2 and FIG. 3 together, in some embodiments, the wafer 100 is mounted to the carrier substrate 900, in accordance with step S130 of FIG. 9. In some embodiments, the bonding layer 910 is located between the carrier substrate 900 and the wafer 100 (including the semiconductor devices 10), for example. In certain embodiments, through the bonding layer 910, the wafer 100 is bonded on the carrier substrate 900 by fusion bonding. In such embodiments, the fusion bonding is a direct bonding between dielectric-to-dielectric bonding (e.g., oxide-to-oxide bonding, nitride-to-nitride bonding, nitride-to-oxide bonding, or combinations thereof). For example, a bonding interface IF1 between the bonding layer 910 and (the interconnect 150A of) the wafer 100 includes a dielectric-to-dielectric bonding interface (e.g., an oxide-to-nitride bonding interface). In the disclosure, the bonding interface IF1 may be referred to as a fusion bonding interface. The fusion bonding process may have a workable temperature approximately from 100° C. to 250° C. and a workable pressure approximately less than or substantially equal to 1 atm. For example, the fusion bonding process includes a hydrophilic fusion bonding process or a hydrophobic fusion bonding process. However, the disclosure is not specifically limited thereto. In the disclosure, the wafer 100 including the semiconductor devices 10 is referred to as a device layer 100 of the integrated circuit component (e.g. 1000 depicted in FIG. 7), for example.

Figure 4:
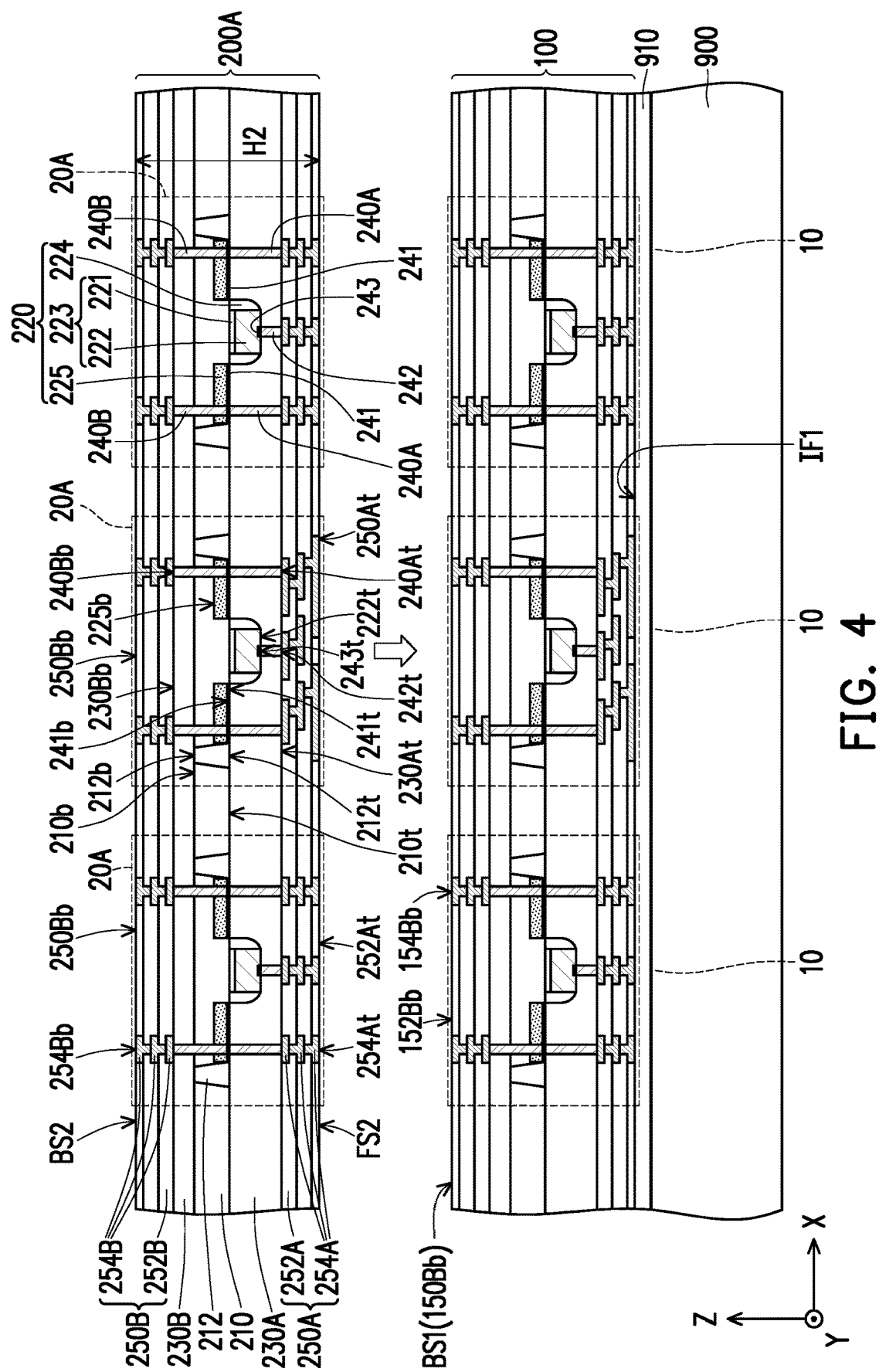

Referring to FIG. 4, in some embodiments, a wafer 200A including at least one semiconductor device is provided, in accordance with step S140 of FIG. 9. In some embodiments, the at least one semiconductor device includes one semiconductor device or multiple semiconductor devices. For example, the at least one semiconductor device includes a plurality of semiconductor devices 20A, such as three semiconductor devices 20A as shown in FIG. 4, for illustrative purposes; the number of semiconductor devices 20A may be more than three, less than three or more than three. The at least one semiconductor device may include a single one semiconductor device 20A. For example, the wafer 200A is processed in a manner similar to or the same as the forming process and material of the wafer 100 as described in FIG. 1 to generate the semiconductor devices 20A; like elements are designated with the similar reference numbers for ease of understanding and the details thereof are not repeated herein, for simplicity.

Figure 17:
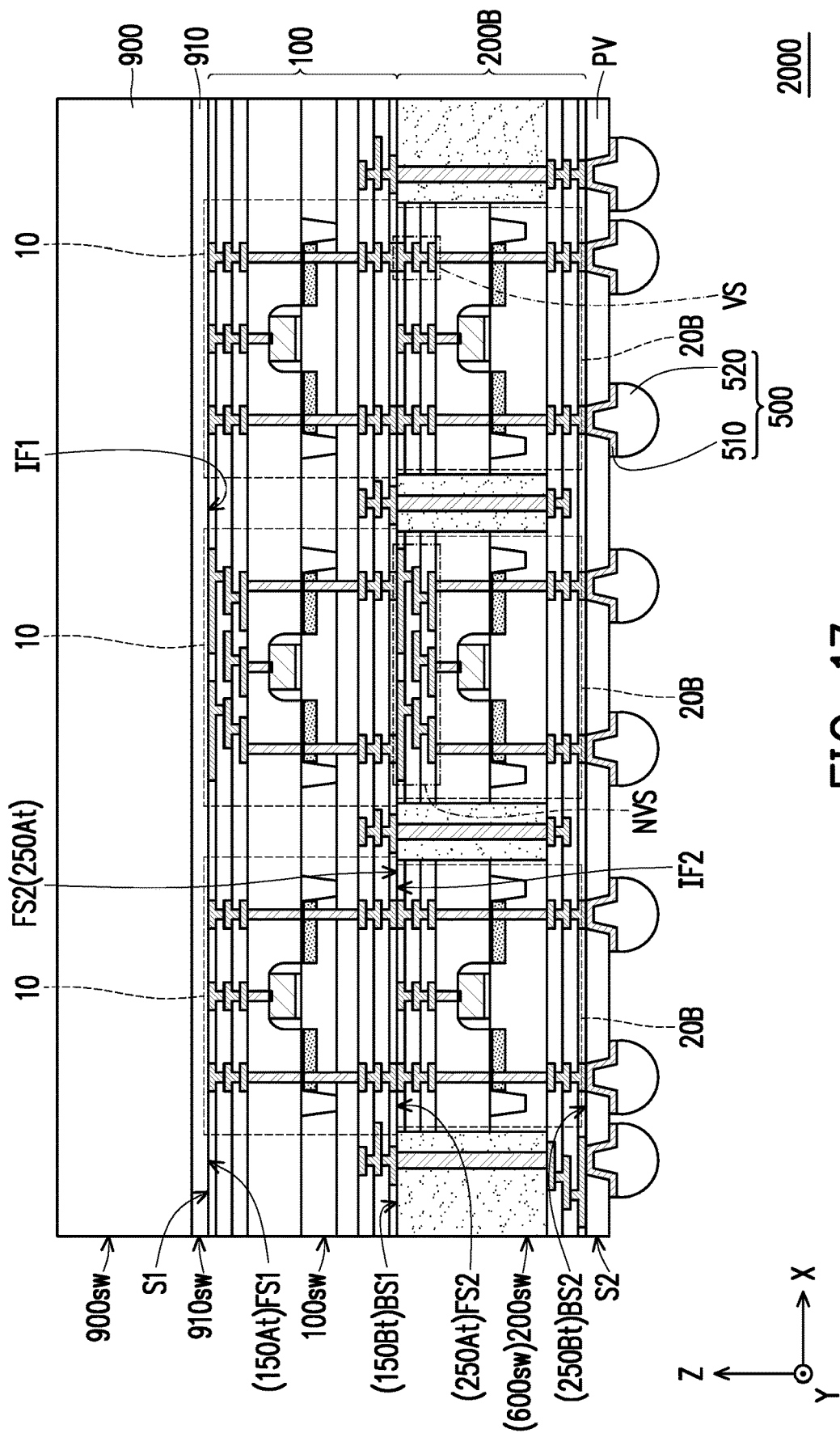

In some embodiments, the wafer 200A includes a semiconductor substrate 210, a plurality of isolation regions 212, a plurality of transistors 220, inter-level dielectric (ILD) layers 230A and 230B, a plurality of metals contacts 240A, 240B, 242, silicide layers 241, 243, and interconnects 250A and 250B. For example, the isolation regions 212 are located inside the semiconductor substrate 210, the transistors 220 are located on and further extended into the semiconductor substrate 210, the ILD layers 230A and 230B are located at two different sides of the semiconductor substrate 210, the metals contacts 240A penetrate through the ILD layer 230A and electrically connect to the transistors 220 through the silicide layers 241, the metals contacts 240B penetrate through the ILD layer 230B and electrically connect to the transistors 220 through the silicide layers 241, the metals contacts 242 penetrate through the ILD layer 230A and electrically connect to the transistors 220 through the silicide layers 243, the interconnect 250A is located on the ILD layer 230A and electrically connects to the transistors 220 through the metal contacts 240A and 242, and the interconnect 250B is located on the ILD layer 230B and electrically connects to the transistors 220 through the metal contacts 240B. In the disclosure, for example, the metal contacts 240B and the interconnect 250B are together serve as a backside power rail of a respective transistor 220 in one semiconductor device 20A. In some embodiments, as shown in FIG. 17, the backside power rail including the metal contacts 240B and the interconnect 250B is physically separated from the interconnect 250A. In other words, the backside power rail including the metal contacts 240B and the interconnect 250B is free from the interconnect 250A and the metal contact 240A.

In some embodiments, one transistor 220 is constituted by one gate structure 223 (including a gate dielectric layer 221 and a gate electrode 222 stacked thereon), one pair of the spacers 224 and one pair of the S/D portions 225. For example, the silicide layers 241 are located over and electrically connected to the S/D portions 225 and the silicide layers 243 are located over and electrically connected to the gate structures 223.

In such example, the ILD layer 230A is located between the interconnect 250A and the semiconductor substrate 210, and the ILD layer 230B is located between the interconnect 250B and the semiconductor substrate 210. In some alternative embodiments, the wafer 200A further includes an etch stop layer (not shown) conformally formed on the transistors 220 and over a surface 210t the semiconductor substrate 210, where the etch stop layer is located between the ILD layer 230A and the semiconductor substrate 210 and between the ILD layer 230A and the transistors 220.

For example, as shown in FIG. 4, the wafer 200A have a front-side surface FS2 and a back-side surface BS2 opposite to the front-side surface FS2 along the direction Z, where the wafer 200A is placed over the wafer 100 by facing the front-side surface FS2 of the wafer 200A towards the back-side surface BS1 of the wafer 100. In some embodiments, along the direction Z, an overall thickness H2 of the wafer 200A is approximately ranging from 2 µm to 20 µm.

Figure 5:
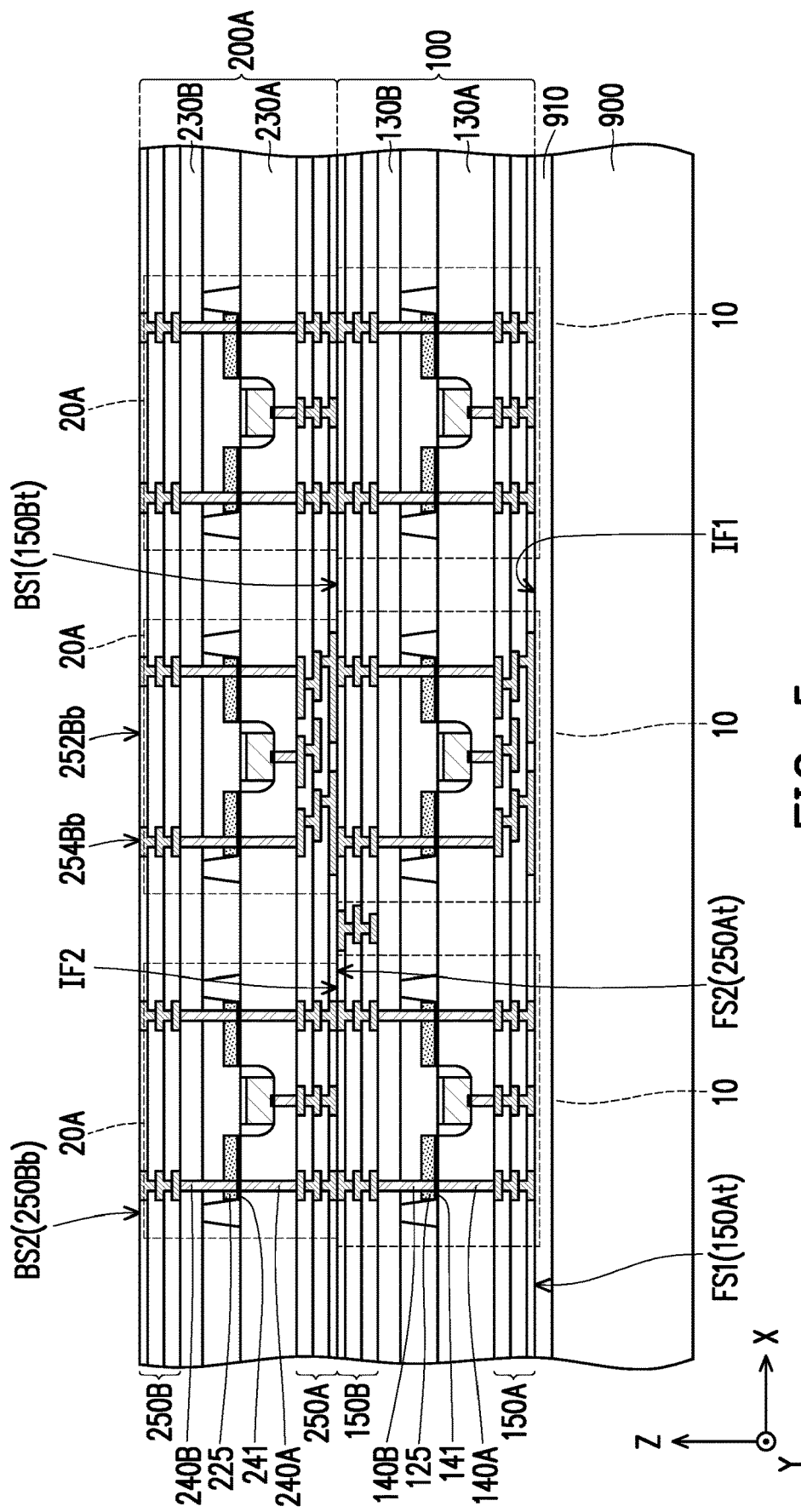

Referring to FIG. 4 and FIG. 5 together, in some embodiments, the wafer 200A is mounted to the wafer 100, in accordance with step S150 of FIG. 9. In certain embodiments, through the interconnect 150B and the interconnect 250A, the wafer 200A is bonded on the wafer 100 in a manner of face-to-back configuration by hybrid bonding. In such embodiments, the hybrid bonding is a direct bonding between metal-to-metal bonding (e.g., copper-to-copper bonding) and dielectric-to-dielectric bonding (e.g., oxide-to-oxide bonding, oxide-to-nitride bonding, or nitride-to-nitride bonding). For example, a bonding interface IF2 between the interconnect 250A of the wafer 200A and the interconnect 150B of the wafer 100 includes a metal-to-metal bonding interface (e.g., a copper-to-copper bonding interface between the metallization pattern 154B at the back-side surface BS1 and the metallization pattern 254A at the front-side surface FS2) and a dielectric-to-dielectric bonding interface (e.g., an oxide-to-nitride bonding interface between the dielectric layer 152B at the back-side surface BS1 and the dielectric layer 252A at the front-side surface FS2). In the disclosure, the bonding interface IF2 may be referred to as a hybrid bonding interface. In the disclosure, the wafer 200A including the semiconductor devices 20A is referred to as a device layer 200 of the integrated circuit component (e.g. 1000 depicted in FIG. 7), for example.

The hybrid bonding process may have a workable temperature approximately from 150° C. to 400° C. and a workable pressure approximately less than or substantially equal to 1 atm. However, the disclosure is not specifically limited thereto. As shown in FIG. 5, for example, the semiconductor devices 10 included in the wafer 100 are electrically connected and communicated to the semiconductor devices 20A included in the wafer 200A through the interconnect 150B and the interconnect 250A.

Referring to FIG. 6, in some embodiments, a passivation layer PV is formed on the wafer 200A and exposes at least portions of the interconnect 250B (e.g., an outermost layer of the metallization patterns 254B). In some embodiments, the passivation layer PV is directly located on the interconnect 250B of the wafer 200A, where openings OP1 formed in the passivation layer PV accessibly reveal at least a part of the outermost layer of the metallization patterns 254B for electrically connecting to the later-formed connectors. In one embodiment, portions of the outermost layer of the metallization patterns 254B exposed by the outermost layer of the dielectric layer 252B each are completely and accessibly exposed by the openings OP1 formed in the passivation layer PV. However, the disclosure is not limited thereto; alternatively, the portions of the outermost layer of the metallization patterns 254B exposed by the outermost layer of the dielectric layer 252B may be partially and accessibly exposed by the openings OP1 formed in the passivation layer PV.

In some embodiments, the passivation layer PV is formed by, but not limited to, forming a blanket layer of dielectric material over the back-side surface BS2 of the wafer 200A to completely cover the wafer 200A; and patterning the dielectric material blanket layer to form the passivation layer PV with the openings OP1 exposing the portions (e.g. the outermost layer of the metallization patterns 254B) of the interconnect 250B underneath thereto. The material of the passivation layer PV may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric material blanket layer is formed by suitable fabrication techniques such as spin-on coating, CVD, (e.g. PECVD), or the like. However, it is appreciated that the scope of this disclosure is not limited to the materials and descriptions disclosed above. In some embodiments, the passivation layer PV is referred to as a protective layer of the underlying layers.

Thereafter, in some embodiments, a plurality of UBM patterns 510 are formed on the passivation layer PV and extend into the openings OP1 formed in the passivation layer PV to physically contact the outermost layer of the metallization pattern 254B exposed therefrom for electrically connecting the interconnect 250B of the wafer 200A. In the disclosure, the UBM patterns 510 facilitate physical and electrical connections between the interconnect 250B of the wafer 200A and later-formed conductive elements (e.g., connectors such as conductive balls or conductive bumps; semiconductor components such as semiconductor passive elements; or the like). However, the disclosure is not limited thereto; alternatively, the UBM patterns 510 may be omitted based on the design layout and demand. The material of the UBM patterns 510 may include copper, nickel, titanium, tungsten, or alloys thereof or the like, and may be formed in a manner of a single-layer or a multi-layer (e.g. with different materials in any two stacked layers in one UBM pattern 510) by an electroplating process. The number of the UBM patterns 510 is not limited in the disclosure, and corresponds to the numbers of the later-formed conductive elements, which can be adjusted by controlling the number of the openings OP1 formed in the passivation layer PV.

Continued on FIG. 6, in some embodiments, a plurality of conductive elements 520 are formed on the wafer 200A, in accordance with step S160 of FIG. 9. For example, the conductive elements 520 are formed on the UBM patterns 510 and over the interconnect 250B of the wafer 200A. In some embodiments, the conductive elements 520 are electrically coupled to the interconnect 250B through the UBM patterns 510. As shown in FIG. 6, for example, the conductive elements 520 are electrically connected to the semiconductor devices 20A included in the wafer 200A through some of the UBM patterns 510. In some embodiments, the conductive elements 520 are electrically connected to the semiconductor devices 10 included in the wafer 100 through at least some of the UBM patterns 510 and at least some of the semiconductor devices 20A included in the wafer 200A.

Due to the UBM patterns 510, the adhesive strength between the conductive elements 520 and the interconnect 250B of the wafer 200A is enhanced. In the disclosure, one UBM pattern 510 and one conductive element 520 may be together referred to as a conductive terminal 500 of the integrated circuit component (e.g. 1000 depicted in FIG. 7). However, the disclosure is not limited thereto; alternatively, the UBM patterns 510 may be omitted, where the conductive elements 520 may extend into openings OP1 for electrical connection with the interconnect 250B of the wafer 200A.

In some embodiments, the conductive elements 520 are attached to the UBM patterns 510 through a solder flux. In some embodiments, the conductive elements 520 may be disposed on the UBM patterns 510 by ball placement process or reflow process. The conductive elements 520 may be micro-bumps, metal pillars or vias, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The numbers of the conductive elements 520 may correspond to the numbers of the UBM patterns 510. When solder is used, the solder may include either eutectic solder or non-eutectic solder. The solder may include lead or be lead-free, and may include Sn—Ag, Sn—Cu, Sn—Ag—Cu, or the like.

The conductive elements 520 may be referred to as conductive input/output terminals of the integrated circuit component (e.g. 1000 depicted in FIG. 7), and may be bonded/mounted to another electronic component through flip chip bonding or hybrid bonding. In one embodiment, the conductive elements 520 are referred to as conductive connectors for connecting with a semiconductor package or a circuit substrate (e.g. organic substrate such as PCB). In an alternative embodiment, the conductive elements 520 are referred to as conductive connectors for inputting/outputting electric and/or power signals. In a further alternative embodiment, the conductive elements 520 are referred to as conductive connectors for connecting with one or more than one semiconductor dies/chips independently including one or more active devices (e.g., transistors, diodes, etc.) and/or one or more passive devices (e.g., capacitors, resistors, inductors, etc.), other components such as one or more integrated passive device (IPDs), or combinations thereof in a semiconductor package. The disclosure is not limited thereto.

Besides, in alternative embodiments, the passivation layer PV may be omitted, the disclosure is not limited thereto. In such embodiments, the conductive terminals 500 are directly formed on the wafer 200A to be in physical and electrical contact with the conductive features (e.g. the metallization patterns 254B) in the interconnect 250 of the wafer 200A. The disclosure is not limited thereto.

Referring to FIG. 7, in some embodiments, the whole structure depicted in FIG. 6 is flipped (turned upside down), and a dicing (singulating) process is performed to cut through the carrier substrate 900, the bonding layer 910, the wafer 100, the wafer 200A and the passivation layer PV to form a plurality of separate and individual integrated circuit components 1000. During the dicing (singulating) process, a holding device (not shown) is adopted to hold the conductive elements 520 for securing the integrated circuit components 1000. The holding device may be an adhesive tape, an adhesive carrier or a suction pad. In some embodiments, after dicing, the conductive elements 520 are released from the holding device to form the integrated circuit components 1000. In one embodiment, the dicing process is a wafer dicing process including mechanical blade sawing or laser cutting. Up to here, the manufacture of the integrated circuit components 1000 is completed. In some embodiments, a sidewall 900sw of the carrier substrate 900 is substantially aligned with a sidewall 910sw of the bonding layer 910, a sidewall 100sw of the device layer 100, a sidewall 200sw of the device layer 200A and a sidewall S2 of the passivation layer PV in the direction Z. In some embodiments, the forming process of the integrated circuit components 1000 is referred to as a Wafer-on-Wafer (WoW) process.

As illustrated in FIG. 7, for example, the integrated circuit component 1000 includes a stack structure, where the integrated circuit component 1000 includes the carrier substrate 900, the device layer 100 including at least one semiconductor device 10 and located on the carrier substrate 900, the device layer 200A including at least one semiconductor device 20A and located on the device layer 100, the passivation layer PV located on the device layer 200A, and conductive terminals 500 including the conductive elements 520. In some embodiments, the device layer 100 is located between the carrier substrate 900 and the device layer 200A, the device layer 200A is located between the device layer 100 and the passivation layer PV, and the passivation layer PV is located between the conductive terminals 500. In some embodiments, the semiconductor devices 10 in the device layer 100 are electrically connected and communicated to the semiconductor devices 20A in the device layer 200A. For example, some of the conductive elements 520 are electrically connected to the semiconductor devices 20A (located in the device layer 200A) through some of the UBM patterns 510, and some of the conductive elements 520 are electrically connected to the semiconductor devices 10 (located in the device layer 100) through the UBM patterns 510 and the semiconductor devices 20A electrically connected thereto. In some embodiments, some of the conductive terminals 500 may be electrically floated or grounded. In some embodiments, some of the conductive terminals 500 may be electrically connected to a power.

In some embodiments, the interconnects 150A of the semiconductor devices 10 and the interconnects 250A of the semiconductor devices 20A each have the metallization patterns (154A and 254A) in a form of vertical-stack pattern (denoted as VS in FIG. 7) and a form of non-vertical-stack pattern (denoted as NVS in FIG. 7) for routing signals (e.g. electrical signals, power signals and/or ground signals) thereto/therefrom. On the other hand, for example, the interconnects 150B of the semiconductor devices 10 and the interconnects 250B of the semiconductor devices 20A each have the metallization patterns (154B and 254B) in a form of vertical-stack pattern (denoted as VS in FIG. 7). It is appreciated that, the vertical-stack pattern VS is considered as a line-up structure, where sidewalls of the metallization patterns stacked on one another (in different layers) are substantially aligned in a vertical cross-section along the direction Z to establish a short electric path, which facilitates the power signal transmission due to a decrease in power loss thereof. On the other hand, it is appreciated that, the non-vertical-stack pattern NVS is considered as a stagger structure, where sidewalls of the metallization patterns stacked on one another (in different layers) are not aligned in a vertical cross-section along the direction Z and is capable of establishing sufficient electric paths for routing functions. Owing to the backside power rails (e.g., the metal contact 140B and the interconnect 150B of the device layer 100 and the metal contact 240B and the interconnect 250B of the device layer 200A), the signal loss in the power transmission to the integrated circuit component 1000 can be reduced, thereby enhancing the electrical performance of the integrated circuit component 1000.

However, the disclosure is not limited thereto; in alternative embodiments, the interconnects 150B of the semiconductor devices 10 and the interconnects 250B of the semiconductor devices 20A each have the metallization patterns (154B and 254B) in a form of non-vertical-stack pattern NVS, a form of vertical-stack pattern VS, or a combination thereof. In further alternative embodiments, the interconnects 150A of the semiconductor devices 10 and the interconnects 250A of the semiconductor devices 20A each have the metallization patterns (154B and 254B) in a form of non-vertical-stack pattern NVS or a form of vertical-stack pattern VS, only.

Figure 18:
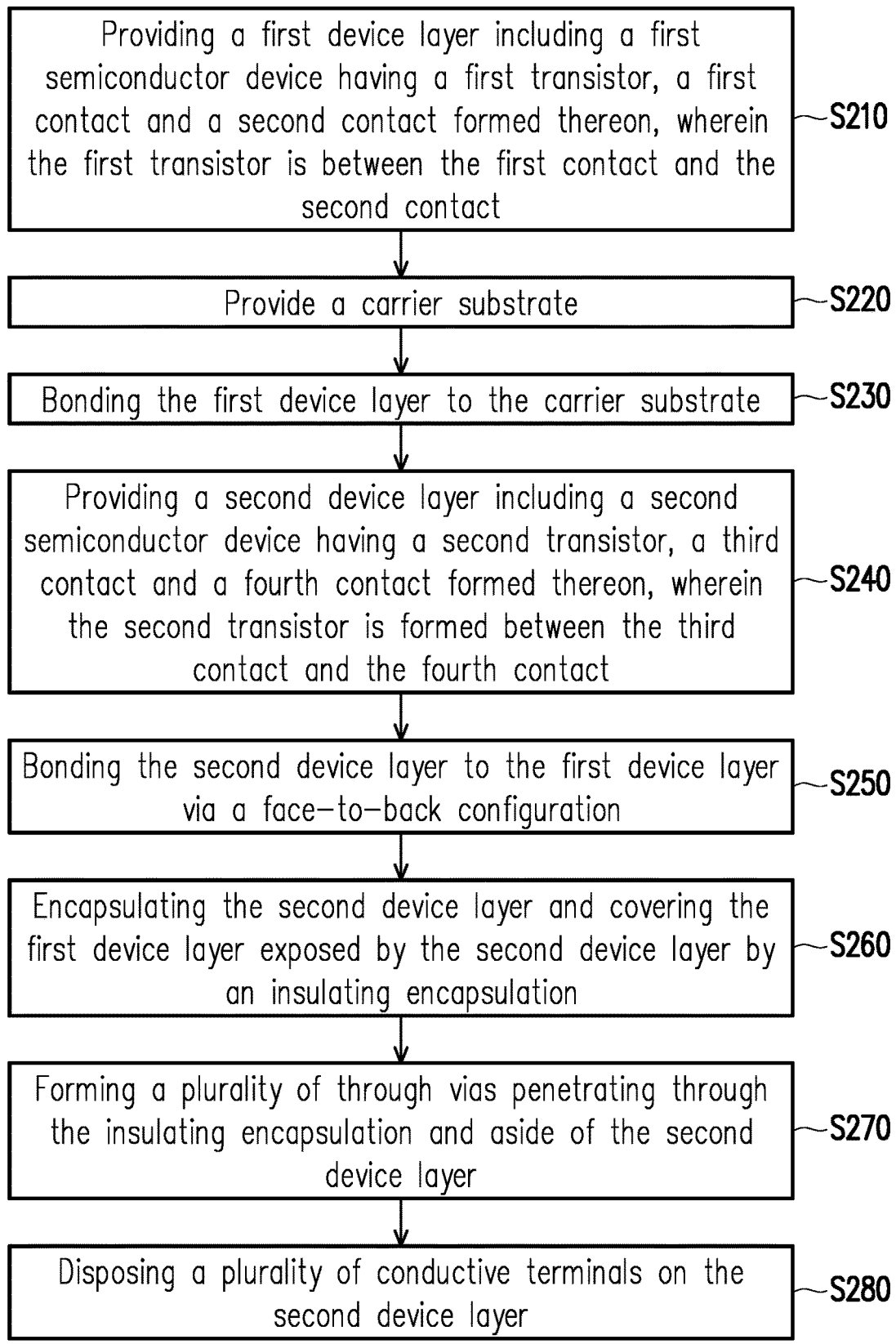
FIG. 18 is a flow chart illustrating a method of manufacturing an integrated circuit component in accordance with some embodiments of the disclosure.

FIG. 10 through FIG. 17 are schematic cross-sectional views of various stages in a manufacturing method of an integrated circuit component in accordance with some embodiments of the disclosure. FIG. 18 is a flow chart illustrating a method of manufacturing an integrated circuit component in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Figure 10:
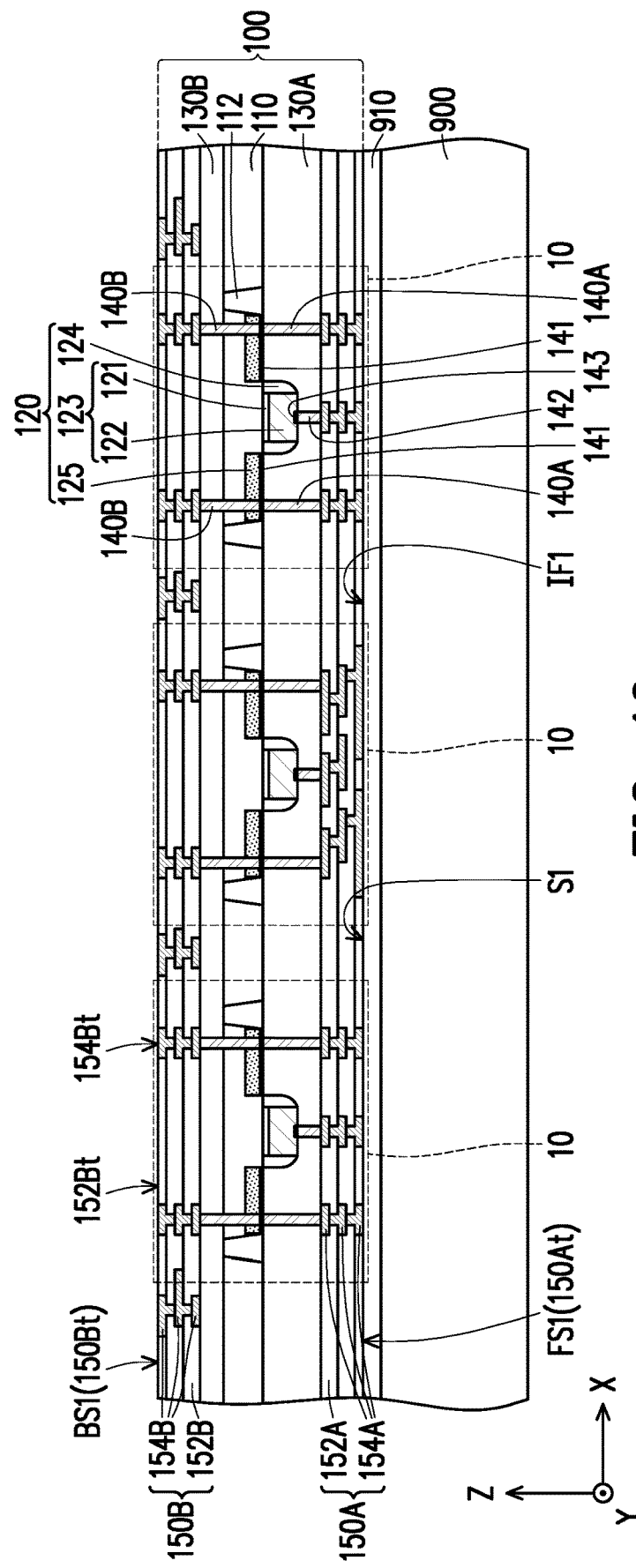
FIG. 10 through FIG. 17 are schematic cross-sectional views of various stages in a manufacturing method of an integrated circuit component in accordance with some embodiments of the disclosure.
Figure 11:
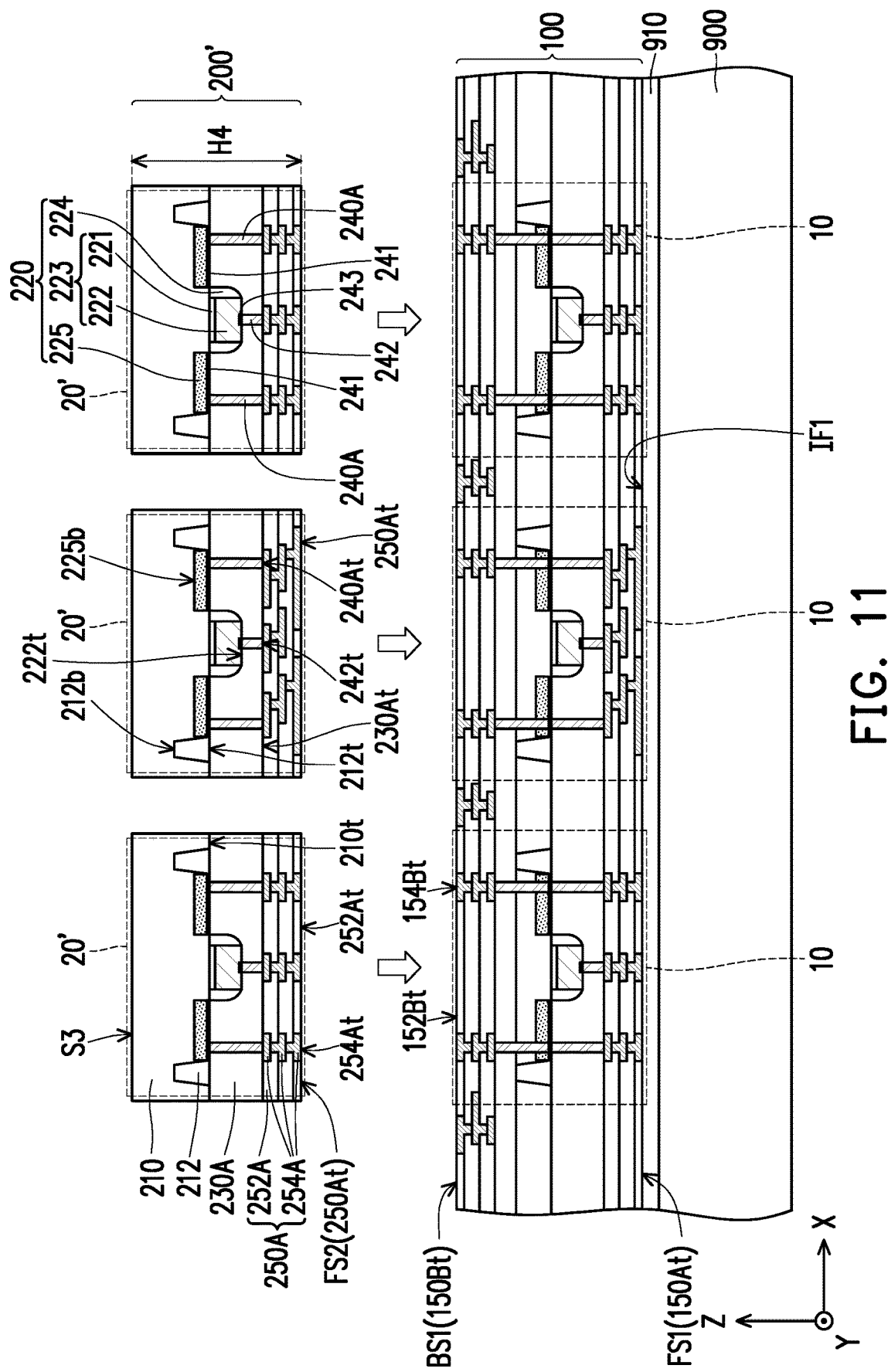

Referring to FIG. 10, in some embodiments, a wafer 100 including at least one semiconductor device 10 is provided, and is bonded to a carrier substrate 900 being provided with a bonding layer 910 coated thereon, in accordance with steps S210 through S230 of FIG. 18. The details of the semiconductor devices 10, the wafer 100, the bonding layer 910 and the carrier substrate 900 are previously described in FIG. 1 through FIG. 3 in conjunction with steps S110-S130 of FIG. 9, and thus are omitted herein for brevity. In the disclosure, the wafer 100 including the semiconductor devices 10 is referred to as a device layer 100 of an integrated circuit component (e.g. 2000 depicted in FIG. 17), for example. As shown in FIG. 10, for example, the wafer 100 is bonded to the bonding layer 910 coated on the carrier substrate 900 through a fusion bonding, where a fusion bonding interface IF1 is presented at the interface of (e.g. the front-side surface FS1 of) the wafer 100 and (e.g. the surface S1 of) the bonding layer 910. In some embodiment the back-side surface BS1 of the wafer 100 is accessibly revealed and facing away from the bonding layer 910. In the disclosure, for example, the metal contacts 140B and the interconnect 150B are together serve as a backside power rail of a respective transistor 120 in one semiconductor device 10. In some embodiments, as shown in FIG. 11, the backside power rail including the metal contacts 140B and the interconnect 150B is physically separated from the interconnect 150A. In other words, the backside power rail including the metal contacts 140B and the interconnect 150B is free from the interconnect 150A and the metal contact 140A.

Referring to FIG. 11, in some embodiments, a set of the semiconductor devices 20' are provided, in accordance with step S240 of FIG. 18. In some embodiments, the semiconductor devices 20' are physically separated from one another and are placed over the wafer 100, where the semiconductor devices 20' each have a front-side surface FS2 facing towards the back-side surface BS1 of the wafer 100. The semiconductor devices 20' are placed over the wafer 100 by using, for example, a pick-and-place process or other suitable attaching techniques. The semiconductor devices 20' may be tested before placing over the wafer 100, so that only known-good-dies (KGDs) are used for attaching. In the disclosure, the semiconductor devices 20' (from the set) are arranged over the wafer 100 side-by-side, which are together referred to as an (intermediate-stage) device layer 200'. In some embodiments, as shown in FIG. 6, along the direction Z, a thickness H4 of the device layer 200' is approximately less than 800 μm, such as about 770 μm. For example, three semiconductor devices 20' are shown in FIG. 11 for illustrative purposes, and the disclosure is not limited thereto. The number of the semiconductor devices 20' may be one or more than one based on the demand and the design layout. In some embodiments, the semiconductor devices 20' each include a semiconductor substrate 210, a plurality of isolation regions 212, a plurality of transistors 220, an inter-level dielectric (ILD) layer 230A, a plurality of metals contacts 240A, 242, silicide layers 241, 243, and an interconnect 250A. The details of the semiconductor substrate 210, the isolation regions 212, the transistors 220, the ILD layer 230A, the metals contacts 240A, 242, the silicide layers 241, 243, and the interconnect 250A are previously described in FIG. 4 in conjunction with steps S140 of FIG. 9, and thus are omitted herein for brevity.

For example, the semiconductor substrate 210 has a surface 210t and a surface S3 opposite to the surface 210t along the direction Z, and the isolation regions 212 are located inside the semiconductor substrate 210 (e.g. not revealed by the surface S3), where the transistors 220 are located on and further extended into the semiconductor substrate 210, the ILD layer 230A is located at the surface 210t of the semiconductor substrate 210, the metals contacts 240A penetrate through the ILD layer 230A and electrically connect to the transistors 220 through the silicide layers 241, the metals contacts 242 penetrate through the ILD layer 230A and electrically connect to the transistors 220 through the silicide layers 243, and the interconnect 250A is located on the ILD layer 230A and electrically connects to the transistors 220 through the metal contacts 240A and 242. In some embodiments, the interconnect 250A includes dielectric layers 252A and metallization patterns 254A arranged in alternation. In some embodiments, one transistor 220 is constituted by one gate structure 223 (including a gate dielectric layer 221 and a gate electrode 222 stacked thereon), one pair of the spacers 224 and one pair of the S/D portions 225. For example, the silicide layers 241 are located over and electrically connected to the S/D portions 225 and the silicide layers 243 are located over and electrically connected to the gate structures 223. In such example, the ILD layer 230A is located between the interconnect 250A and the semiconductor substrate 210. In some alternative embodiments, the semiconductor devices 20' each further include an etch stop layer (not shown) conformally formed on the transistors 220 and over the surface 210t the semiconductor substrate 210, where the etch stop layer is located between the ILD layer 230A and the semiconductor substrate 210 and between the ILD layer 230A and the transistors 220.

Figure 12:
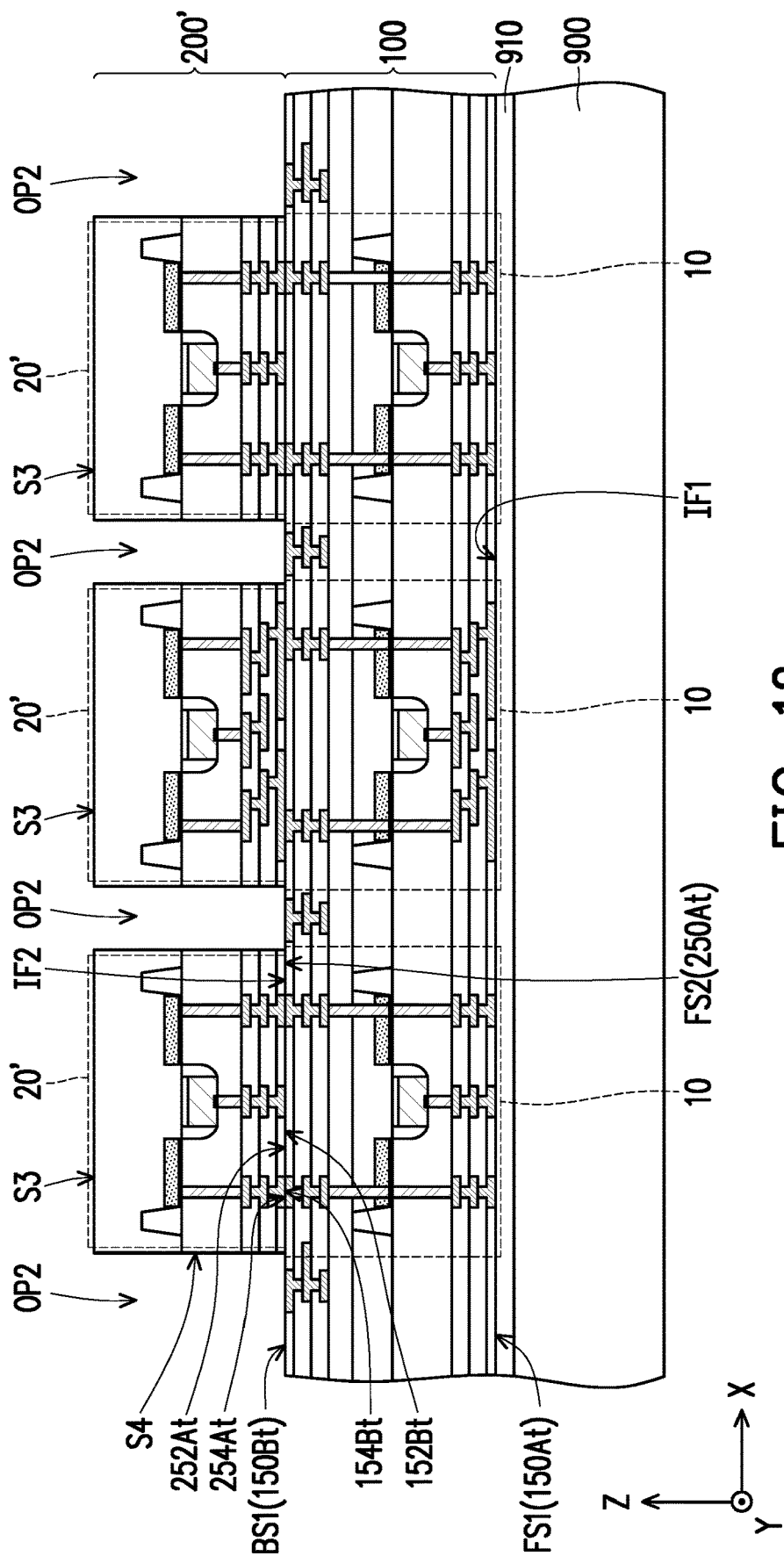

Referring to FIG. 11 and FIG. 12 together, in some embodiments, the device layer 200' is mounted to the wafer 100, in accordance with step S250 of FIG. 18. In certain embodiments, through the interconnect 150B of the wafer 100 and the interconnects 250A of the semiconductor devices 20', the semiconductor devices 20' of the device layer 200' are bonded on the wafer 100 in a manner of face-to-back configuration by hybrid bonding. The details of the hybrid bonding are previously described in FIG. 4 and FIG. 5 in conjunction with steps S150 of FIG. 9, and thus are omitted herein for brevity. For example, a bonding interface IF2 between the interconnect 250A of each of the semiconductor devices 20' and the interconnect 150B of the wafer 100 includes a metal-to-metal bonding interface (e.g., a copper-to-copper bonding interface between the metallization pattern 154B at the back-side surface BS1 and the metallization pattern 254A at the front-side surface FS2) and a dielectric-to-dielectric bonding interface (e.g., an oxide-to-nitride bonding interface between the dielectric layer 152B at the back-side surface BS1 and the dielectric layer 252A at the front-side surface FS2). In the disclosure, the bonding interface IF2 may be referred to as a hybrid bonding interface. As shown in FIG. 12, for example, the semiconductor devices 10 included in the wafer 100 are electrically connected to the semiconductor devices 20' included in the device layer 200' through the interconnect 150B and the interconnects 250A. In some embodiments, a portion of the back-side surface BS1 of the wafer 100 is exposed by the semiconductor devices 20'. In other words, the wafer 100 is partially revealed by a plurality of openings OP2 between the semiconductor devices 20' included in the device layer 200'.

Figure 13:
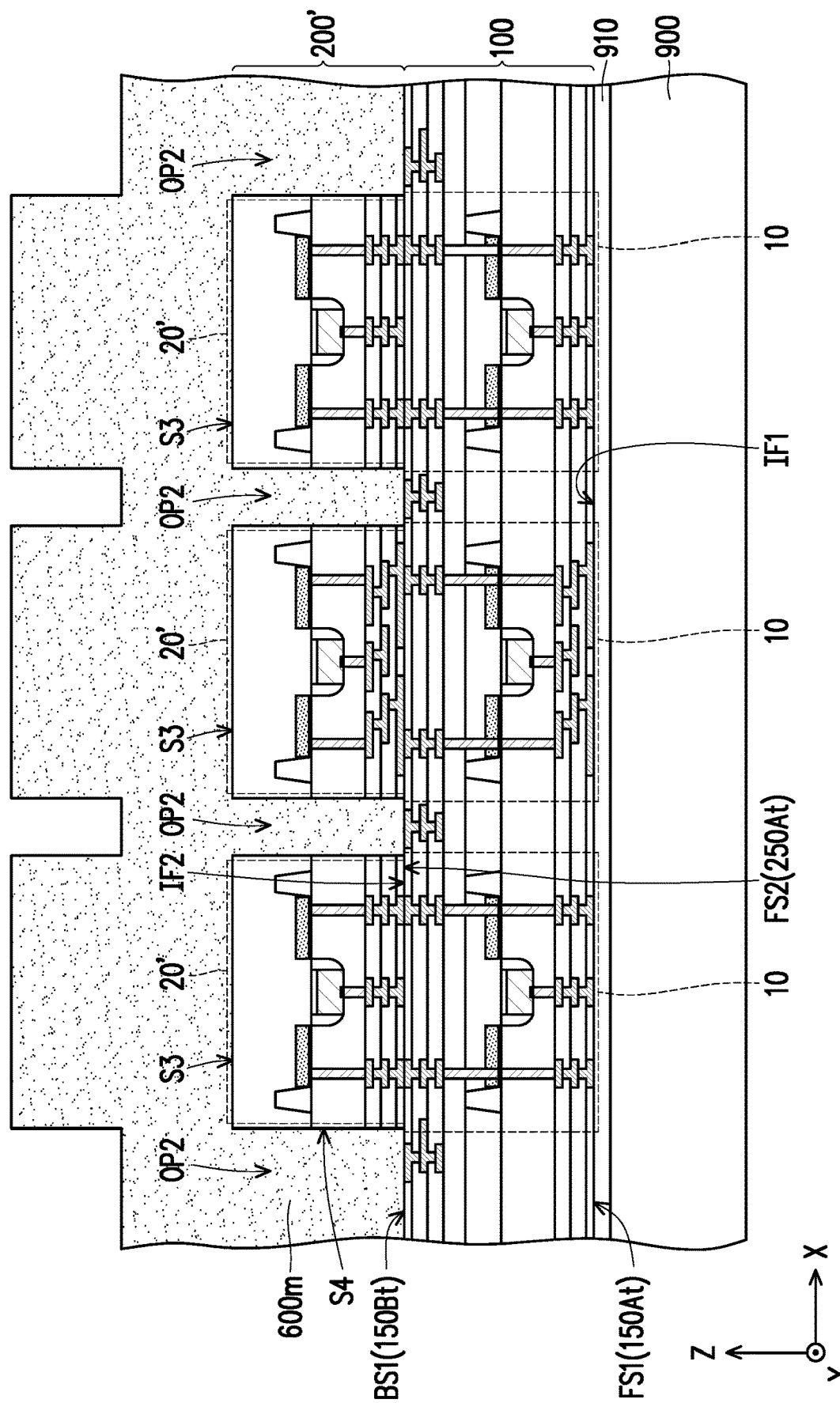

Referring to FIG. 13, in some embodiments, an insulating encapsulation 600m is formed on the device layer 200' and over the wafer 100, in accordance with step S260 of FIG. 18. For example, the insulating encapsulation 600m is conformally formed on the device layer 200', where the device layer 200' and the back-side surface BS1 of the wafer 100 exposed by the device layer 200' are covered by the insulating encapsulation 600m. In some embodiments, the surface S3 and a sidewall S4 of each of the semiconductor devices 20' are physically contacted with and encapsulated by the insulating encapsulation 600m, where the sidewall S4 connects the front-side surface FS2 and the surface S3. The insulating encapsulation 600m may be made of a dielectric material (such as an oxide (e.g. silicon oxide), a nitride (e.g. silicon nitride), TEOS, or the like) or any suitable insulating materials for gap fill, and may be formed by deposition (such as a CVD process). As shown in FIG. 13, the semiconductor devices 20' of the device layer 200' and the semiconductor devices 10 of the wafer 100 are not accessibly revealed by the insulating encapsulation 600m, for example.

Figure 14:
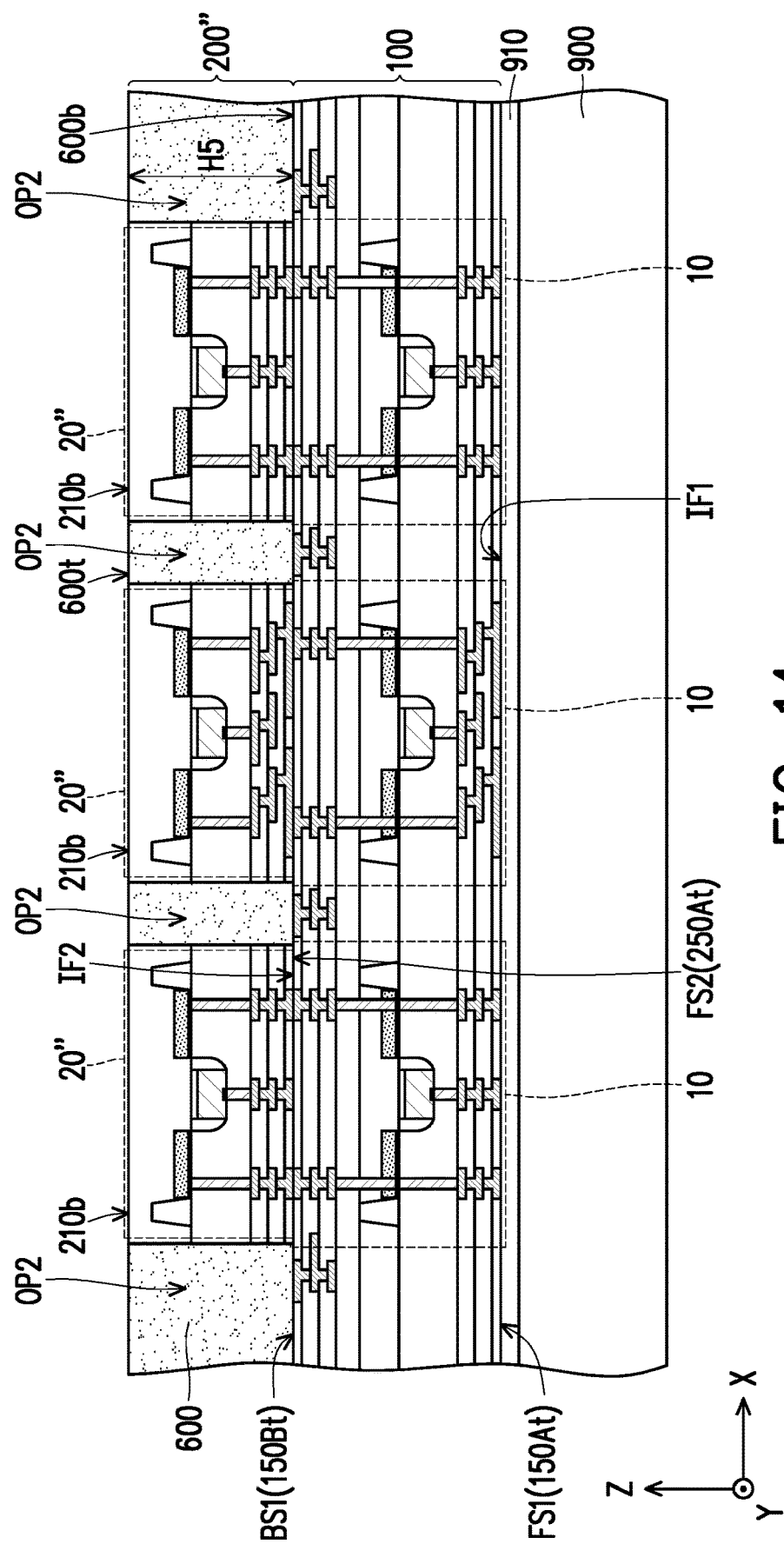

Referring to FIG. 14, in some embodiments, a planarizing process is performed on the insulating encapsulation 600m to form an insulating encapsulation 600 exposing the semiconductor devices 20'. For example, a portion of the insulating encapsulation 600m is removed to form the insulating encapsulation 600 having a top surface 600t, where the top surface 600t is a flat and planar surface. During the planarizing process, the semiconductor substrates 210 of one or more than one of the semiconductor devices 20', for example, are further planarized (e.g. by thinning process) to form semiconductor devices 20" (of a device layer 200") having a thickness H5 less than the thickness H4 depicted in FIG. 11 along the direction Z. For example, the semiconductor devices 20" are referred to as thinned semiconductor devices. In some embodiments, the semiconductor devices 20" each have a surface 210b being substantially leveled with the top surface 600t of the insulating encapsulation 600. For example, the surfaces 210b of the semiconductor devices 20" are substantially coplanar to the top surface 600t of the insulating encapsulation 600. The sidewalls S4 of the semiconductor devices 20" and the front-side surface FS1 of the wafer 100 exposed by the semiconductor devices 20" are covered by the insulating encapsulation 600, in some embodiments. For example, a bottom surface 600b of the insulating encapsulation 600 is substantially coplanar with the front-side surface FS2 of the semiconductor devices 20", where in direction Z, the front-side surface FS2 is opposite to the surface 210b and is connected to the surface 210b through the sidewall S4. In other words, the bottom surface 600b of the insulating encapsulation 600 props against the back-side surface BS1 of the wafer 100 exposed by the semiconductor devices 20". As shown in FIG. 14, the semiconductor devices 20" (e.g. the surfaces 210b thereof) are accessibly revealed by the insulating encapsulation 600, for example.

In some embodiments, the planarizing process may include a grinding process, a CMP process, etching process or combinations thereof, the disclosure is not limited thereto. After the planarizing process, a cleaning process may be optionally performed, for example to clean and remove the residue generated from the planarizing process. However, the disclosure is not limited thereto, and the planarizing process may be performed through any other suitable method.

Figure 15:
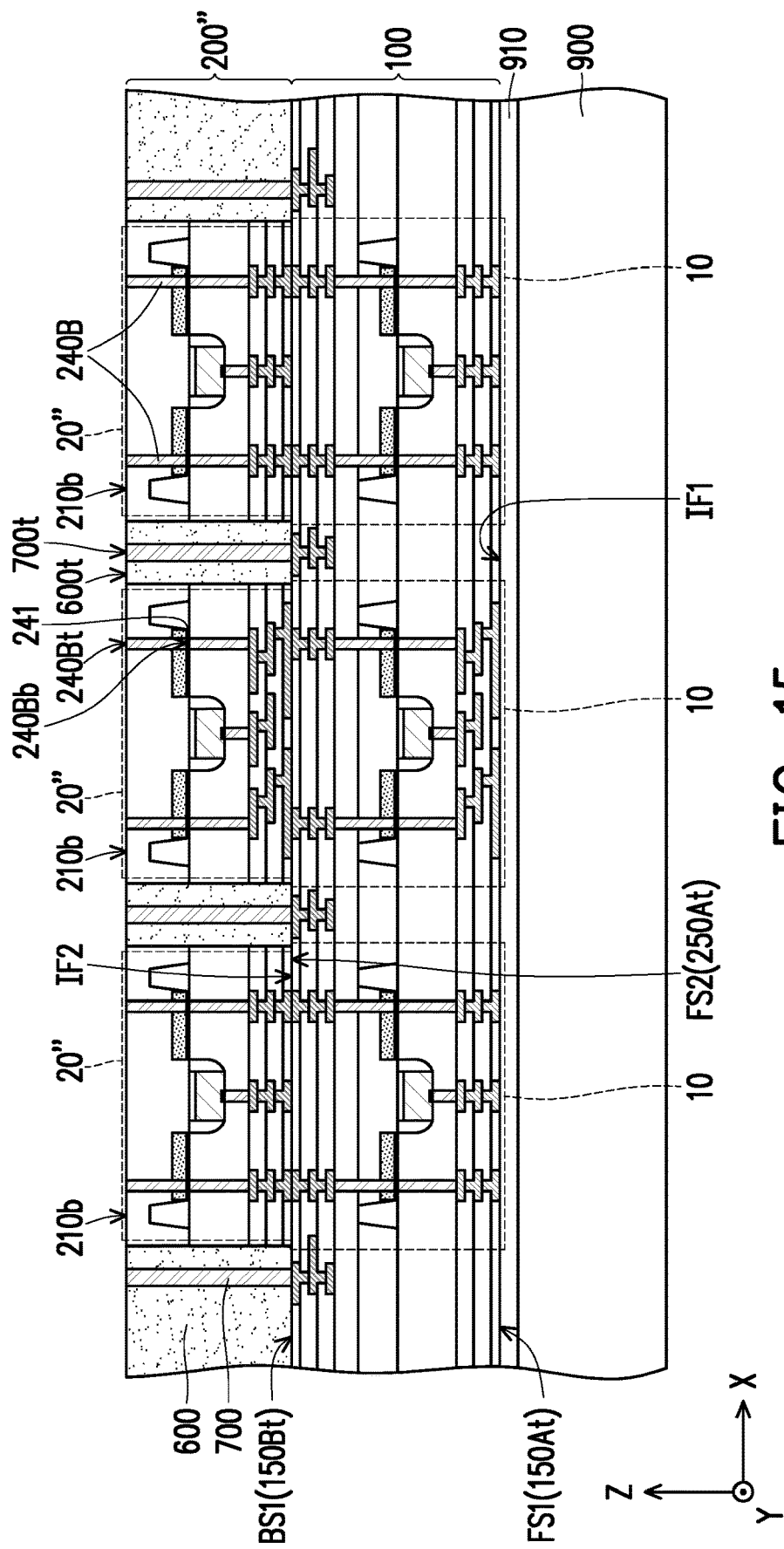

Referring to FIG. 14 and FIG. 15, in some embodiments, after the insulating encapsulation 600 is formed, a plurality of through pillars 700 are formed, where the through pillars 700 penetrate through the insulating encapsulation 600 and arranged aside of the semiconductor device 20", in accordance with step S270 of FIG. 18. In some embodiments, a plurality of first through holes (not labeled) are formed in and penetrate through the insulating encapsulation 600 to expose at least portions of the outermost layer of the metallization patterns 154B of the interconnect 150B of the wafer 100. In some embodiments, the first through holes are formed by a laser drilling process. Thereafter, in some embodiments, after the formation of the first through holes, a conductive material is formed over the device layer 200" and in the first through holes to form the conductive pillars 700 connecting to the exposed portions of the outermost layer of the metallization patterns 154B of the interconnect 150B of the wafer 100. The conductive material may be formed by filling and curing the conductive paste to form the conductive pillars 700, or may be formed by electroplating. As shown in FIG. 15, the conductive pillars 700 are electrically connected to the semiconductor devices 10 of the wafer 100 through the metallization patterns 154B connected thereto, for example.

As illustrated in FIG. 15, in some embodiments, a plurality of metal contacts 240B are formed in the semiconductor devices 20", where in each semiconductor device 20", the metal contacts 240B are embedded in the semiconductor substrate 210 and extend from the surface 210b to the silicide layers 241. For example, the metal contacts 240B each have a surface 240Bb in contact with a respective one of the silicide layers 241, where the metal contacts 240B are electrically connected to the transistors 220. For example, the metal contacts 240B is formed by, but not limited to, forming a plurality of second through holes (not labeled) in the semiconductor substrates 210 to expose at least portions of the silicide layers 241. In some embodiments, the second through holes are formed by a laser drilling process. For example, the second through holes are not penetrated through the entire semiconductor substrates 210, where a thickness of the second through holes are less than a thickness of the semiconductor substrates 210 along the direction Z. Thereafter, in some embodiments, after the formation of the second through holes, a conductive material is formed over the device layer 200" and in the second through holes to form the metal contacts 240B connecting to the exposed portions of the silicide layers 241 of the semiconductor devices 20". The conductive material may be formed by filling and curing the conductive paste to form the metal contacts 240B, or may be formed by electroplating. As shown in FIG. 15, the metal contacts 240B are electrically connected to the semiconductor devices 20" by having surfaces 240Bb in contact with the silicide layers 241, where the surfaces 240Bb are embedded in the semiconductor substrates 210, for example.

For example, only two second through holes in one semiconductor substrates 210 and fourth first through holes are shown in FIG. 15 for illustrative purpose, however the disclosure is not limited thereto. That is, the numbers of the first through holes (e.g. the conductive pillars 700) and the second through holes (e.g., the metal contact 240B) may independently be one or more than one depending on the demand. In some embodiments, if considering the first through holes and/or the second through holes are holes with substantially round-shaped cross-section (from the top view on the X-Y plane), each of the first through holes and/or the second through holes includes a vertical sidewall (from the cross sectional view depicted un FIG. 15), where each of first through holes has a top opening (at the top surface 600t) having a top diameter and a bottom opening (at the bottom surface 600b) having a bottom diameter, and the top diameter is substantially equal to the bottom diameter. Alternatively, each of the first through holes and/or the second through holes may include a slant sidewall, where the top diameter may be greater than the bottom diameter. The cross-sectional shape of each of the first through holes and/or the second through holes on the X-Y plane is, for example, rectangular, elliptical, oval, tetragonal, octagonal or any suitable polygonal shape.

In one embodiment, after the formations of the conductive pillars 700 and metal contacts 240B, a planarizing step may be optionally performed so that the top surface 600a of the insulating encapsulant 600, the surfaces 210b of the semiconductor substrates 210, surfaces 700t of the conductive pillars 700 and surfaces 240Bt of the metal contacts 240B are substantially levelled with and coplanar to each other, as shown in FIG. 15. In some embodiments, the planarizing step may include a grinding process, a CMP process, etching process or combinations thereof, the disclosure is not limited thereto. After the planarizing process, a cleaning process may be optionally performed, for example to clean and remove the residue generated from the planarizing process. However, the disclosure is not limited thereto, and the planarizing process may be performed through any other suitable method. Due to the high degree of coplanarity and flatness between the top surface 600a of the insulating encapsulant 600, the surfaces 210b of the semiconductor substrates 210, surfaces 700t of the conductive pillars 700 and surfaces 240Bt of the metal contacts 240B, the later-formed layer(s) can be formed on a flat structure.

The conductive pillars 700 and the metal contacts 240B may be formed in different steps. In some embodiments, the conductive pillars 700 are formed prior to the formation of the metal contact 240B. In other embodiments, the conductive pillars 700 are formed after the formation of the metal contact 240B. The disclosure is not limited thereto.

Alternatively, the conductive pillars 700 and the metal contacts 240B may be formed in a same step. In some embodiments, the first through holes are formed prior to the formation of the second through holes. In other embodiments, the first through holes are formed after the formation of the second through holes. After the formations of the first and second through holes, the conductive material is formed in the first and second through holes at once to form the conductive pillars 700 and the metal contacts 240B.

Figure 16:
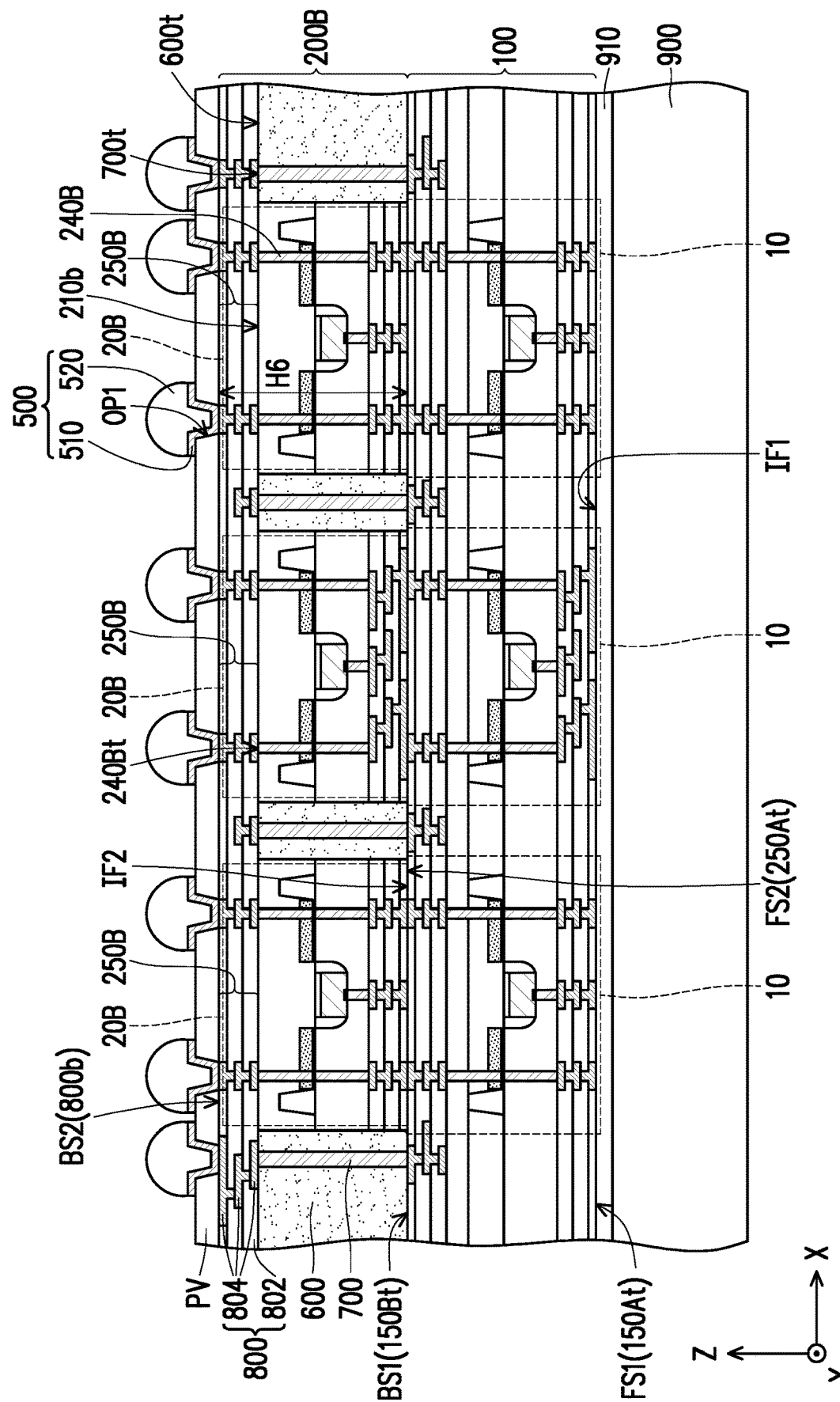

Referring to FIG. 16, in some embodiments, a redistribution circuit structure 800 is formed on the insulating encapsulation 600. In some embodiments, the redistribution circuit structure 800 is fabricated to electrically connect with one or more connectors underneath. Here, the afore-said underlying connectors may be the conductive pillars 700 and the metal contacts 240B. In the disclosure, portions of the redistribution circuit structure 800 located above the semiconductor substrates 210 are considered as interconnect 250B for the transistors 220, such that a plurality of semiconductor devices 20B are formed. In the disclosure, for example, the metal contacts 240B and the interconnect 250B are together serve as a backside power rail of a respective transistor 220 in a semiconductor device 20B. In some embodiments, as shown in FIG. 16, the backside power rail including the metal contacts 240B and the interconnect 250B is physically separated from the interconnect 250A. In other words, the backside power rail including the metal contacts 240B and the interconnect 250B is free from the interconnect 250A and the metal contact 240A.

In some embodiments, the redistribution circuit structure 800 is electrically connected to the semiconductor devices 20B by direct contact with the metal contacts 240B, and the semiconductor devices 20B are electrically communicated and connected to each other through the redistribution circuit structure 800. In some embodiments, the redistribution circuit structure 800 is electrically connected to the semiconductor devices 10 of the device layer 100 through the conductive pillars 700 and/or the semiconductor devices 20B. In some embodiments, the semiconductor devices 20B share the redistribution circuit structure 800, and the redistribution circuit structure 800 is referred to as a common interconnect of the semiconductor devices 20 or a redistribution layer of the integrated circuit component (e.g. 2000 depicted in FIG. 17).

As shown in FIG. 16, the semiconductor devices 10 are electrically connected and communicated to the semiconductor devices 20B through the conductive pillars 700 and the redistribution circuit structure 800 and/or through the interconnects 150B and the interconnects 250A, in some embodiments. That is, after the formation of the redistribution circuit structure 800, a device layer 200B of the integrated circuit component (e.g. 2000 depicted in FIG. 17) is formed, where the device layer 200B includes the semiconductor devices 20B, the insulating encapsulation 600 laterally encapsulating the semiconductor devices 20B, the conductive pillars 700 penetrating the insulating encapsulation 600 and the redistribution circuit structure 800 located on the insulating encapsulation 600 and electrically connected to the semiconductor devices 20B and the conductive pillars 700, in some embodiments.

In the device layer 200B, each of the semiconductor devices 20B includes the semiconductor substrate 210, the isolation regions 212, at least one transistor 220, the ILD layer 230A, the metals contacts 240A, 240B, 242, the silicide layers 241, 243, and the interconnects 250A and 250B. For example, the isolation regions 212 are located inside the semiconductor substrate 210, the at least one transistor 220 is located on and further extended into the semiconductor substrate 210, the ILD layer 230A is located at the surface 210t of the semiconductor substrate 210, the metals contacts 240A penetrate through the ILD layer 230A and electrically connect to the at least one transistor 220 through the silicide layers 241, the metals contacts 240B penetrate through the ILD layer 230B and electrically connect to the at least one transistor 220 through the silicide layers 241, the metals contacts 242 embedded in the semiconductor substrate 210 and electrically connect to the at least one transistor 220 through the silicide layers 243, the interconnect 250A is located on the ILD layer 230A and electrically connects to the at least one transistor 220 through the metal contacts 240A and 242, and the interconnect 250B is located on the surface 210b of the semiconductor substrate 210 and electrically connects to the at least one transistor 220 through the metal contacts 240B. The details of the semiconductor substrate 210, the isolation regions 212, the transistors 220, the ILD layer 230A, the metals contacts 240A, 242, 240B, the silicide layers 241, 243, and the interconnects 250A, 250B are previously described in FIG. 4 in conjunction with steps S140 of FIG. 9, and thus are omitted herein for brevity. In some embodiments, the device layer 200B has the front-side surface FS2 in contact with the back-side surface BS1 of the device layer 100 and a back-side surface BS2 opposite to the front-side surface FS2 along the direction Z, and an overall thickness H6 of each of the device layer 200B is approximately ranging from 2 μm to 20 μm.

In some embodiments, the redistribution circuit structure 800 includes a plurality of dielectric layers 802 and a plurality of metallization patterns 804 stacked alternately. For example, the metallization patterns 804 are electrically connected to the conductive pillars 700 and the metal contacts 240B. As shown in FIG. 16, in some embodiments, the surfaces 700t of the conductive pillars 700 and the surfaces 240Bt of the metal contacts 240B are in contact with a bottommost layer of the metallization patterns 804. In some embodiments, the surface 700t of the conductive pillars 700 and the surfaces 240Bt of the metal contacts 240B are partially covered by a bottommost layer of the dielectric layer 802. In some embodiments, a topmost layer of the metallization patterns 804 is exposed by a topmost layer of the dielectric layers 802 for electrically connecting to one or more connectors above. Here, the afore-said overlying connectors may be later-formed connectors, such as conductive terminals or the like.

In some embodiments, the material of the dielectric layers 802 includes PI, epoxy resin, acrylic resin, phenol resin, BCB, PBO, or any other suitable polymer-based dielectric material, and the dielectric layers 802 may be formed by deposition. In some embodiments, the material of the metallization patterns 804 includes aluminum, titanium, copper, nickel, tungsten, and/or alloys thereof, and the metallization patterns 804 may be formed by electroplating or deposition. The numbers of the layers of the dielectric layers 802 and the metallization patterns 804 may be may be designated based on the demand and/or design layout, and is not specifically limited to the disclosure.

In one embodiment, the material of the dielectric layers 802 is the same as the material of the dielectric layers 152A and/or 152B. Alternatively, the material of the dielectric layers 802 may be different from the material of the metallization patterns 154A and/or 154B. In one embodiment, the material of the metallization patterns 804 is the same as the material of the dielectric layers 152A and/or 152B. Alternatively, the material of the metallization patterns 804 may be different from the material oft the metallization patterns 154A and/or 154B. The disclosure is not limited thereto.

Continued on FIG. 16, in some embodiments, a passivation layer PV is formed on a surface 800b of the redistribution circuit structure 800 (e.g. the back-side surface BS2 of the device layer 200B) and exposes at least portions of the redistribution circuit structure 800 (e.g., the topmost layer of the metallization patterns 804). In some embodiments, openings OP1 formed in the passivation layer PV accessibly reveal at least a part of the topmost layer of the metallization patterns 804 for electrically connecting to the later-formed connectors. In one embodiment, the portions of the topmost layer of the metallization patterns 804 exposed by the topmost layer of the dielectric layers 802 are partially and accessibly exposed by the openings OP1 formed in the passivation layer PV. However, the disclosure is not limited thereto; alternatively, portions of the topmost layer of the metallization patterns 804 exposed by the topmost layer of the dielectric layers 802 each may be completely and accessibly exposed by the openings OP1 formed in the passivation layer PV. The details of the passivation layer PV has been previously described in FIG. 6, and thus are not repeated herein for brevity.

Thereafter, in some embodiments, a plurality of UBM patterns 510 are formed on the passivation layer PV and extend into the openings OP1 formed in the passivation layer PV to physically contact the topmost layer of the metallization patterns 804 exposed therefrom for electrically connecting the interconnects 250B (of the semiconductor devices 20B) of the device layer 200B. In the disclosure, the UBM patterns 510 facilitate physical and electrical connections between the interconnects 250B of the device layer 200B and later-formed conductive elements (e.g., connectors such as conductive balls or conductive bumps; semiconductor components such as semiconductor passive elements; or the like). However, the disclosure is not limited thereto; alternatively, the UBM patterns 510 may be omitted based on the design layout and demand. The details of the UBM patterns 510 has been previously described in FIG. 6, and thus are not repeated herein for brevity. The number of the UBM patterns 510 is not limited in the disclosure, and corresponds to the numbers of the later-formed conductive elements, which can be adjusted by controlling the number of the openings OP1 formed in the passivation layer PV.

Continued on FIG. 16, in some embodiments, a plurality of conductive elements 520 are formed on the device layer 200B, in accordance with step S280 of FIG. 18. For example, the conductive elements 520 are formed on the UBM patterns 510 and over the redistribution circuit structure 800. In some embodiments, the conductive elements 520 are electrically coupled to the redistribution circuit structure 800 through the UBM patterns 510. As shown in FIG. 16, for example, some of the conductive elements 520 are electrically connected to the semiconductor devices 20B included in the device layer 200B through some of the UBM patterns 510. In some embodiments, some of the conductive elements 520 are electrically connected to the semiconductor devices 10 included in the device layer 100 through some of the UBM patterns 510, the redistribution circuit structure 800 and the conductive pillars 700 and/or through some of the UBM patterns 510 and the semiconductor devices 20B included in the device layer 200B. Due to the UBM patterns 510, the adhesive strength between the conductive elements 520 and the redistribution circuit structure 800 is enhanced. In the disclosure, one UBM pattern 510 and one conductive element 520 may be together referred to as a conductive terminal 500 of the integrated circuit component (e.g. 2000 depicted in FIG. 17). However, the disclosure is not limited thereto; alternatively, the UBM patterns 510 may be omitted, where the conductive elements 520 may extend into openings OP1 for electrical connections with the redistribution circuit structure 800. The details of the conductive elements 520 has been previously described in FIG. 6, and thus are not repeated herein.

The conductive elements 520 may be referred to as conductive input/output terminals of the integrated circuit component (e.g. 2000 depicted in FIG. 17). In one embodiment, the conductive elements 520 are referred to as conductive connectors for connecting with a semiconductor package or a circuit substrate (e.g. organic substrate such as PCB). In an alternative embodiment, the conductive elements 520 are referred to as conductive connectors for inputting/outputting electric and/or power signals. In a further alternative embodiment, the conductive elements 520 are referred to as conductive connectors for connecting with one or more than one semiconductor dies/chips independently including one or more active devices (e.g., transistors, diodes, etc.) and/or one or more passive devices (e.g., capacitors, resistors, inductors, etc.), other components such as one or more IPDs, or combinations thereof in a semiconductor package. The disclosure is not limited thereto.

Besides, in alternative embodiments, the passivation layer PV may be omitted, the disclosure is not limited thereto. In such embodiments, the conductive terminals 500 are directly formed on the device layer 200B to be in physical and electrical contact with the conductive features (e.g. the interconnect 250B and the conductive pillars 700) underlying thereto. The disclosure is not limited thereto.

Referring to FIG. 17, in some embodiments, the whole structure depicted in FIG. 16 is flipped (turned upside down), and a dicing (singulating) process is performed to cut through the carrier substrate 900, the bonding layer 910, the device layer 100, the device layer 200B and the passivation layer PV to form a plurality of separate and individual integrated circuit components 2000. Up to here, the manufacture of the integrated circuit components 2000 is completed. The details of the dicing process have been previously described in FIG. 7, and thus are not repeated herein for simplicity. In some embodiments, a sidewall 900sw of the carrier substrate 900 is substantially aligned with a sidewall 910sw of the bonding layer 910, a sidewall 100sw of the device layer 100, a sidewall 200sw of the device layer 200B (e.g. a sidewall 600sw of the insulating encapsulation 600) and a sidewall S2 of the passivation layer PV in the direction Z. In some embodiments, the forming process of the integrated circuit components 2000 is referred to as a Chip-on-Wafer (CoW) process.

As illustrated in FIG. 17, for example, the integrated circuit component 2000 includes a stack structure with the carrier substrate 900, the device layer 100, the device layer 200B, the passivation layer PV and conductive terminals 500 sequentially stacked. In some embodiments, the device layer 100 includes at least one semiconductor device 10, and the device layer 200B includes at least one semiconductor device 20B, the insulating encapsulation 600 laterally encapsulating the semiconductor device 20B, the conductive pillars 700 embedded in the insulating encapsulation 600 and the redistribution circuit structure 800 on the insulating encapsulation 600, where the redistribution circuit structure 800 electrically connected to the at least one semiconductor device 20B and the conductive pillars 700. In some embodiments, the passivation layer PV is located on the device layer 200B, and the conductive terminals 500 includes the UBM patterns 510 and the conductive elements 520. In some embodiments, some of the conductive terminals 500 may be electrically floated or grounded. In some embodiments, some of the conductive terminals 500 may be electrically connected to a power. Owing to the backside power rails (e.g., the metal contact 140B and the interconnect 150B of the device layer 100 and the metal contact 240B and the interconnect 250B of the device layer 200B), the signal loss in the power transmission to the integrated circuit component 2000 can be reduced, thereby enhancing the electrical performance of the integrated circuit component 2000.

In some embodiments, the interconnects 150A of the semiconductor devices 10 and the interconnects 250A of the semiconductor devices 20B each have the metallization patterns (154A and 254A) in a form of vertical-stack pattern (not labeled) and a form of non-vertical-stack pattern (not labeled) for routing signals (e.g. electrical signals, power signals and/or ground signals) thereto/therefrom. On the other hand, for example, the interconnects 150B of the semiconductor devices 10 and the interconnects 250B of the semiconductor devices 20B each have the metallization patterns (154B and 254B) in a form of vertical-stack pattern (not labeled). However, the disclosure is not limited thereto; in alternative embodiments, the interconnects 150B of the semiconductor devices 10 and the interconnects 250B of the semiconductor devices 20B each have the metallization patterns (154B and 254B) in a form of non-vertical-stack pattern, a form of vertical-stack pattern, or a combination thereof. In further alternative embodiments, the interconnects 150A of the semiconductor devices 10 and the interconnects 250A of the semiconductor devices 20B each have the metallization patterns (154B and 254B) in a form of non-vertical-stack pattern or a form of vertical-stack pattern, only.

In alternative embodiments, in the above CoW process, before the formation of the redistribution circuit structure 800 and the insulating encapsulation 600, the semiconductor devices 20' may be substituted by semiconductor devices 20A separated from each other, where the separate semiconductor devices 20A are bonded to the device layer 100 in the way similar to the semiconductor devices 20', and the device layer 200B may include the semiconductor devices 20, the insulating encapsulation and the conductive pillars 700. The separate and individual semiconductor devices 20 may be formed by performing a dicing (singulating) process to the wafer 200A as described in the FIG. 4.

In the above embodiments, the number of the semiconductor devices 10 are the same as the number of the semiconductor devices 20A and/or 20B. However, the disclosure is not limited thereto; alternatively, the number of the semiconductor devices 10 may be different from the number of the semiconductor devices 20A and/or 20B.

In addition, in a projection on the carrier substrate 900 along the direction Z, an occupying area of the semiconductor devices 10 may be the same as an occupying area of the semiconductor devices 20A and/or 20B. However, the disclosure is not limited thereto; alternatively, in the projection on the carrier substrate 900, an occupying area of the semiconductor devices 10 may be different from an occupying area of the semiconductor devices 20A and/or 20B.

Furthermore, in alternative embodiments, the device layer 100 included in the integrated circuit components 1000 and/or 2000 is formed on the carrier substrate 900 by, but not limited to, bonding a first wafer (having a semiconductor substrate 110m, the isolation regions 112, the plurality of transistors 120, the ILD layer 130A, the metals contacts 140A, 142, the silicide layers 141, 143 and the interconnect 150A) to the carrier substrate 900, thinning the semiconductor substrate 110m to form the semiconductor substrate 110, and forming the ILD layer 130B, the metals contacts 140B and the interconnect 150B on the semiconductor substrate 110 to form the device layer 100 having the thickness approximately ranging from 2 µm to 20 µm. On the other hand, the device layer 200A included in the integrated circuit component 1000 may be formed on the device layer 1000 by, but not limited to, bonding a second wafer (having a semiconductor substrate 210m, the isolation regions 212, the plurality of transistors 220, the ILD layer 230A, the metals contacts 240A, 242, the silicide layers 241, 243 and the interconnect 250A) to the device layer 100, thinning the semiconductor substrate 210m to form the semiconductor substrate 210, and forming the ILD layer 230B, the metals contacts 240B and the interconnect 250B on the semiconductor substrate 210 to form the device layer 200A having the thickness approximately ranging from 2 µm to 20 µm. The aforesaid first and second wafer may have a thickness approximately less than 800 less than 800 µm (such as about 770 µm).

However, the disclosure is not limited thereto. In further alternative embodiments, there may be an integrated circuit component having a semiconductor device of a fin structure, such as integrated circuit components 3000 and 400, which are described as follows.

Figure 19:
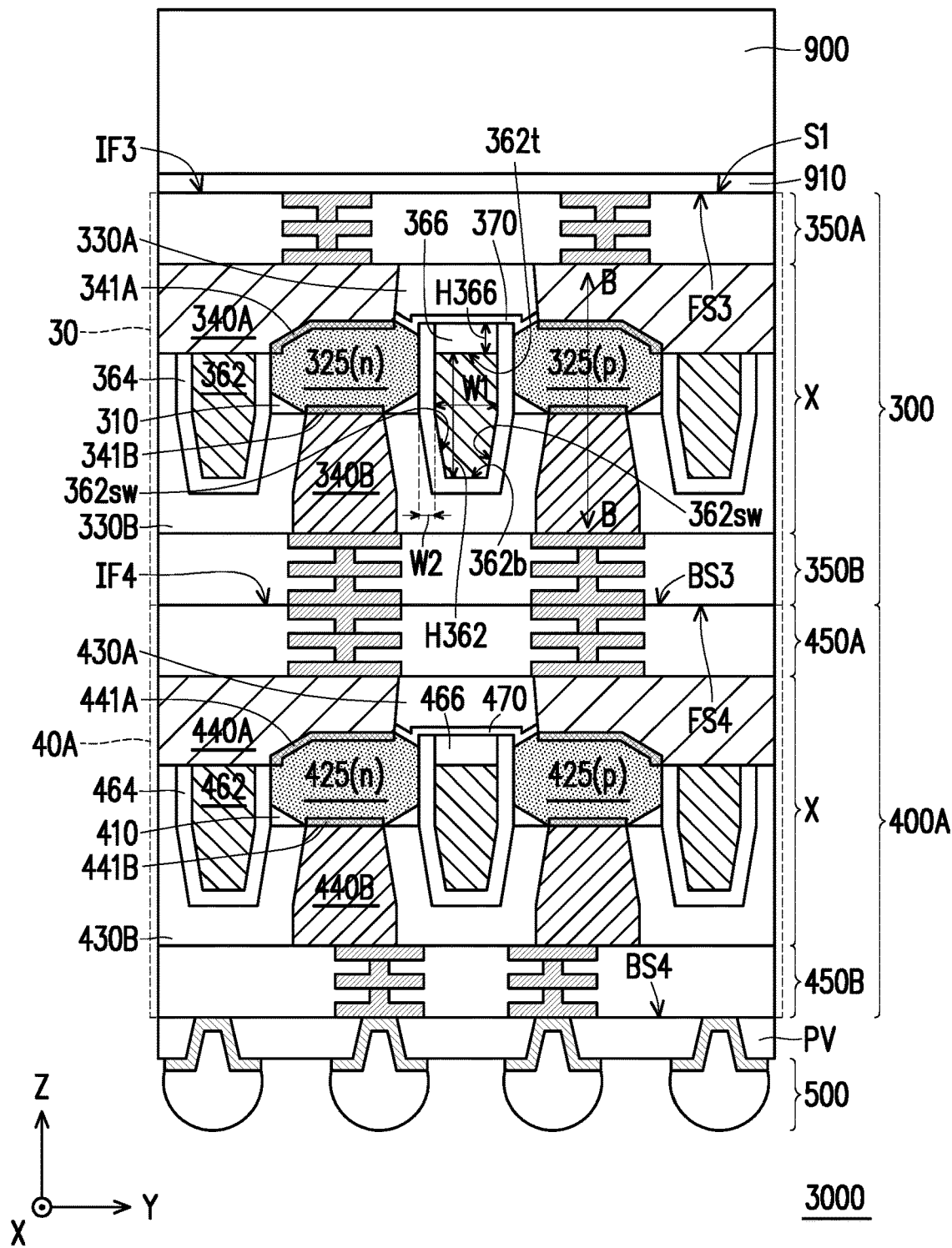
FIG. 19 is a schematic cross-sectional view of an integrated circuit component in accordance with some embodiments of the disclosure.
Figure 20:
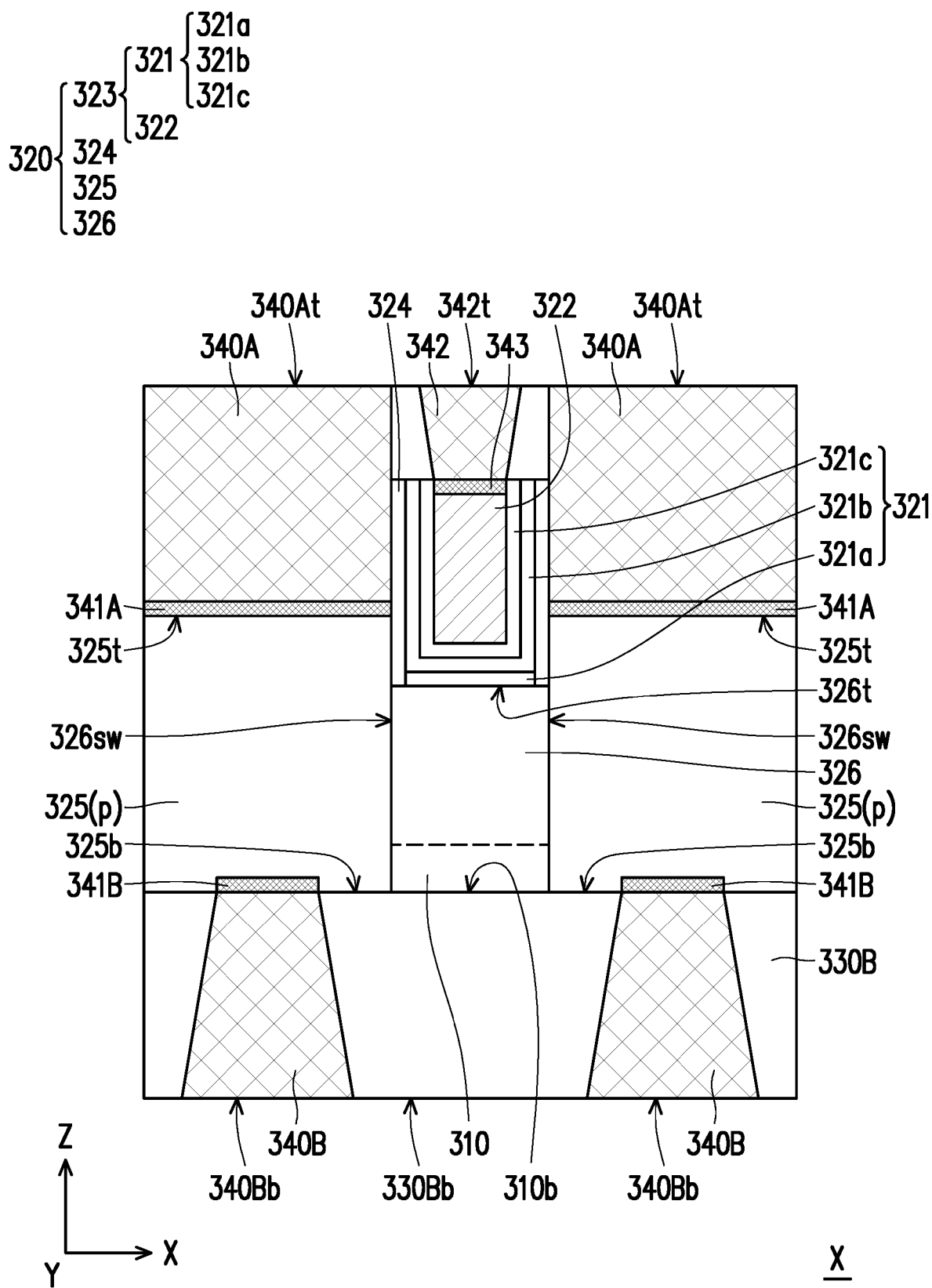
FIG. 20 is a schematic cross-sectional view of a semiconductor device in accordance with some embodiments of the disclosure.
Figure 21:
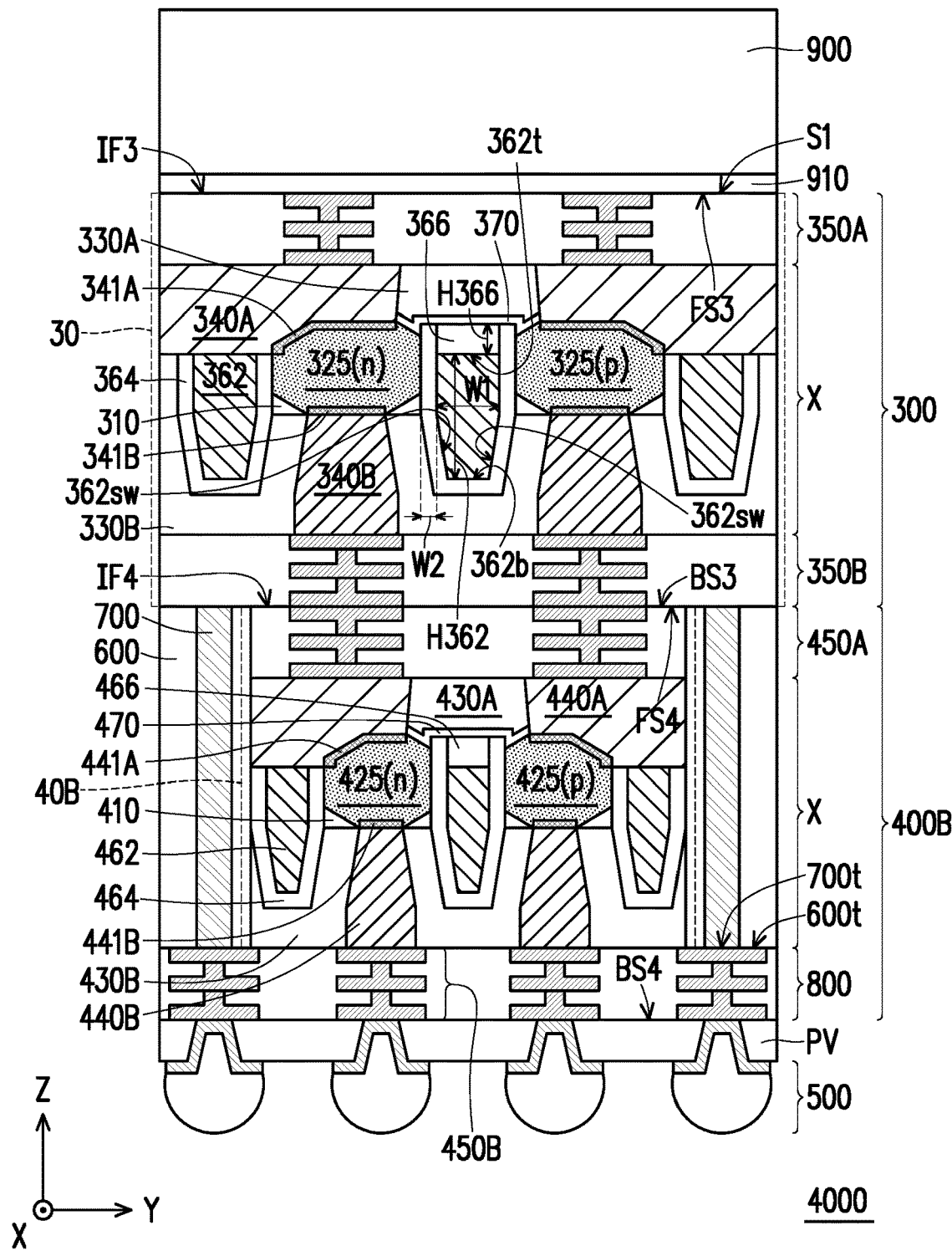
FIG. 21 is a schematic cross-sectional view of an integrated circuit component in accordance with some embodiments of the disclosure.

FIG. 19 is a schematic cross-sectional view of an integrated circuit component in accordance with some embodiments of the disclosure. FIG. 20 is a schematic cross-sectional view of a semiconductor device in accordance with some embodiments of the disclosure. FIG. 21 is a schematic cross-sectional view of an integrated circuit component in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 19, in some embodiments, the integrated circuit component 3000 includes a carrier substrate 900, a bonding layer 910, a device layer 300 having at least one semiconductor device 30, a device layer 400A having at least one semiconductor device 40A, a passivation layer PV and a plurality of conductive terminals 500. The details of the carrier substrate 900 and the bonding layer 910 have been previously described in FIG. 2, the details of the passivation layer PV and the conductive terminals 500 have been previously presented in FIG. 6, and thus are not repeated herein for simplicity.

In some embodiments, the bonding layer 910 is located on the carrier substrate 900, and the device layer 300 is located on the carrier substrate 900 by bonding to the bonding layer 910 through fusion bonding, where the bonding layer 910 is sandwiched between the carrier substrate 900 and the device layer 300. For example, a fusion bonding interface IF3 is presented at the interface of (e.g. a front-side surface FS3 of) the device layer 300 and (e.g. a surface S1 of) the bonding layer 910, as shown in FIG. 19. In some embodiments, the front-side surface FS3 of the device layer 300 is connected to the surface S1 of the bonding layer 910.

In some embodiments, the device layer 400A is located on the device layer 300, and the device layer 300 is located sandwiched between the bonding layer 910 and the device layer 400A, where the deice layer 400A is bonded to the device layer 300 through hybrid bonding. For example, a hybrid bonding interface IF4 is presented at the interface of (e.g. a back-side surface BS3 of) the device layer 300 and (e.g. a front-side surface FS4 of) the device layer 400A, as shown in FIG. 19. In some embodiments, the back-side surface BS3 of the device layer 300 is connected to the front-side surface FS4 of the device layer 400A. That is, the semiconductor device 40A included in the device layer 400A is boned to the semiconductor device 30 included in the device layer 300 in a manner of face-to-back configuration, for example. In some embodiments, the semiconductor device 40A included in the device layer 400A is boned to the semiconductor device 30 included in the device layer 300 are electrically connected to each other. The details of the semiconductor devices 30 and 40A will be described in great detail in conjunction with FIG. 20 later.

In some embodiments, the passivation layer PV is located on the device layer 400A (e.g. at a back-side surface BS4 thereof), and the conductive terminals 500 are located on the passivation layer PV, where the device layer 400A is located sandwiched between the device layer 300 and the passivation layer PV, and the passivation layer PV is located sandwiched between the device layer 400A and the conductive terminals 500. In some embodiments, the conductive terminals 500 are electrically connected to the semiconductor device 40A included in the device layer 400A. In some embodiments, the conductive terminals 500 are electrically connected to the semiconductor device 30 included in the device layer 300 through the semiconductor device 40A included in the device layer 400A.

For illustrative purposes, only one semiconductor device 30 is shown to be included in the device layer 300 and only one semiconductor device 40A is shown to be included in the device layer 400A, however the number of the semiconductor device 30 included in the device layer 300 and the number of the semiconductor device 40A included in the device layer 400A are not limited to the drawings of the disclosure, and may be one or more than one depending on the demand or design layout. The number of the semiconductor device 30 may be the same or different from the number of the semiconductor device 40A.

Referring to FIG. 19 and FIG. 20 together, FIG. 19 illustrates the cross-sectional view of the integrated circuit component 3000 on a Y-Z plane, while FIG. 20 is a cross-sectional view on X-Z plane taken along a line BB illustrating a portion (e.g. a transistor) of the semiconductor device 30 included in the integrated circuit component 3000 in a dashed area X outlined in FIG. 19. In some embodiments, the semiconductor device 30 includes a semiconductor substrate 310, at least one transistor 320, silicide layers 341A, 341B, 343, ILD layers 330A, 330B, metal contacts 340A, 340B, 342, and the interconnects 350A, 350B. The formations and materials of the semiconductor substrate 310, the ILD layer 330A, the ILD layer 330B, the metal contacts 340A, the metal contacts 340B, the silicide layers 341A, 341B, the metal contact 342, the silicide layer 343, the interconnect 350A and the interconnect 350B are respectively similar to or the same as the formations and materials of the semiconductor substrate 110, the ILD layer 130A, the ILD layer 130B, the metal contacts 140A, the metal contacts 140B, the silicide layers 141, the metal contact 142, the silicide layer 143, the interconnect 150A and the interconnect 150B previous described in FIG. 1, and thus are not repeated herein for simplicity.

As shown in FIG. 20, in some embodiment the transistor 320 includes a gate structure 323 (including a gate dielectric structure 321 and a gate electrode 322), a pair of spacers 324, S/D portions 325, and semiconductor fins 326. For example, the semiconductor fins 326 are located on the semiconductor substrate 310, the gate structure 323 and the spacers 324 are located on a side (e.g. surfaces 326t) of the semiconductor fins 326, and the S/D portions 325 are located at two opposite sides (e.g. sidewalls 326sw) of the semiconductor fins 326 with respect to the gate structure 323. In some embodiments, the spacers 324 are located at two opposite sides of the gate structure 323 on the surfaces 326t of the semiconductor fins 326. For example, along the direction Z, the semiconductor fins 326 each are located between the gate structure 323 and the semiconductor substrate 310 and between the spacers 324 and the semiconductor substrate 310. In some embodiments, the semiconductor device 300 further includes isolation regions (not shown) disposed in the semiconductor substrate 310, and the semiconductor fins 326 protrude above and from between neighboring isolation regions.

A material of the semiconductor fins 326 may be the similar or similar to the semiconductor substrate 310, and thus is not repeated herein. In addition, a material of the isolation regions may include oxide or the like and may be formed by deposition and etching. The semiconductor fins 326 and the isolation regions may be formed by patterning the semiconductor substrate 310 to form a plurality of semiconductor fins 326 each sandwiched between trenches (not penetrating through the semiconductor substrate 310), and filling a dielectric material into the trenches to form a plurality of the isolation regions (partially filled the trenches). For example, the surfaces 326t of the semiconductor fins 326 are protruding from the semiconductor substrate 310 and the isolation regions. The formation and material of the spacers 324 are similar to or the same as the formation and material of the spacers 124 previous described in FIG. 1, the formations and materials of the S/D portions 325 are similar to or the same as the formation and material of the S/D portions 125 previous described in FIG. 1 (e.g. the epitaxy growth process with doping process), and thus are not repeated herein for simplicity. For example, as shown in FIG. 19, the transistor 320 is a CMOS device includes both NMOS and PMOS transistors sharing the gate structure 323, where the NMOS transistor having a pair of S/D portions 325(n) doped with N-type dopant and located at two opposite sides of one semiconductor fin 326 (not shown), and the PMOS transistor having a pair of S/D portions 325(p) doped with P-type dopant and located at two opposite sides of one semiconductor fin 326 (see the cross-sectional view of FIG. 20). In other words, the S/D portions 325 of the semiconductor device 320 includes the S/D portions 325(p) and the S/D portions 325(n). However, the disclosure is not limited thereto, alternatively, the semiconductor device 320 may be a NMOS transistor with the gate structure 323, the semiconductor fin 360 and the S/D portion 325(n) or a PMOS transistor with the gate structure 323, the semiconductor fin 360 and the S/D transistor 325(p).

In some embodiments, the gate structure 323 includes the gate dielectric structure 321 and the gate electrode 322, where the gate electrode 322 is located on the gate dielectric structure 321. For example, the gate dielectric structure 321 includes an interfacial oxide layer 321a, a high dielectric contact (high-k) layer 312b and a work function layer 312c, where in the cross-sectional view of X-Z plane, the interfacial oxide layer 321a is in form of a planar film sandwiched between the spacers 324 and on the semiconductor fin 326, and the high-k layer 312b and the work function layer 312c each are in form of a U-shape films sandwiched between the spacers 324 and sequentially stacked on the interfacial oxide layer 321a. As shown in FIG. 20, the high-k layer 312b is located between the interfacial layer 312a and the work function layer 312c and is located between the spacers 324 and the work function layer 312c, and the work-function layer 312c is located between the high-k layer 312b and the gate electrode layer 322, in some embodiments.

The interfacial oxide layer 312a may include a dielectric material such as silicon oxide layer ($SiO_2$) or silicon oxynitride (SiON). In some embodiments, the interfacial oxide layer 312a may be formed by a deposition process such as ALD, CVD, and/or other suitable deposition methods. The interfacial oxide layer 312a may be adapted to provide a good interface between the semiconductor surface (i.e., the semiconductor fin 326) and a gate insulator (i.e., the high-k layer 312b) and to suppress the mobility degradation of the channel carrier of the transistor 320. In some embodiments, the high-k layer 312b has a dielectric constant greater than about 4, greater than about 12, greater than about 16, or even greater than about 20. A material of the high-k layer 312b may include metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. The high-k layer 312b may optionally include a silicate such as HfSiO, HfSiON LaSiO, AlSiO, a combination thereof, or a suitable material. In some embodiments, the method of forming the high-k layer 312b includes performing at least one suitable deposition technique, such as CVD, PECVD, metal oxide chemical vapor deposition (MOCVD), ALD, remote plasma atomic layer deposition (RPALD), PEALD, molecular beam deposition (MBD), or the like. A material of the work function layer may include p-type work function metals or n-type work function metals. For example, the p-type work function metals include TiN, TaN, Ru, Mo, Al, WN, ZrSi$_2$, MoSi$_2$, TaSi$_2$, NiSi$_2$, WN, other suitable p-type work function materials, or combinations thereof. For example, the n-type work function metals include Ti, Ag, TaAl, TaAlC, TiAlN, TaC, TaCN, TaSiN, Mn, Zr, other suitable n-type work function materials, or combinations thereof. In some embodiments, the method of forming the work function layer 312c includes performing at least one suitable deposition technique, such as CVD, PECVD, ALD, RPALD, PEALD, MBD, or the like. The work function layer 312c may serve the purpose of adjusting threshold voltage (Vt) of the transistor 320. In addition, the gate dielectric structure 321 may further include an addition layer (e.g. a barrier layer) between the work-function layer 312c and the gate electrode 322, the disclosure is not limited thereto.

Continued on FIG. 20, in some embodiments, the ILD layer 330A and the ILD layer 330B are located at two different sides of the transistor 320, where the ILD layer 330A exposes a part of the gate electrode 322 and a part of each of the S/D portions 325, and the ILD layer 330B exposes a part of each of the S/D portions 325. In some embodiments, the silicide layers 341A are located on illustrated top surfaces 325t of the S/D portions 325 exposed by the ILD layer 330A, the silicide layers 341B are located on bottom surfaces 325b of the S/D portions 325 exposed by the ILD layer 330B, and the silicide layers 343 are located on an illustrated top surface (not labeled) of the gate electrode 322 exposed by the ILD layer 330A. For example, the bottom surfaces 325b of the S/D portions 325 are exposed by a bottom surface 310b of the semiconductor substrate 310 by removing portions of the semiconductor substrate 310, where the removed portions of the semiconductor substrate 310 are immediately underlying the S/D portion 325 and are next to portions of the semiconductor substrate 310 immediately underlying the semiconductor fins 326. In some embodiments, the metal contacts 340A penetrating the ILD layer 330A are electrically coupled to the transistor 320 through connecting to the silicide layers 341A in contact with the S/D portions 325, the metal contacts 340B penetrating the ILD layer 330B are electrically coupled to the transistor 320 through connecting to the silicide layers 341B in contact with the S/D portions 325, and the metal contacts 342 penetrating the ILD layer 330A are electrically coupled to the transistor 320 through connecting to the silicide layers 343 in contact with the gate electrode 322.

In some embodiments, as shown in FIG. 20, top surfaces 340t of the metal contacts 340A, a top surface 342t of the metal contact 342 and a top surface 330At of the ILD layer 330A are substantially levelled with and coplanar to each other. In some embodiments, bottom surfaces 340b of the metal contacts 340B and a top surface 330Bt of the ILD layer 330B are substantially levelled with and coplanar to each other. Due to the high degree of planarity and flatness in the top surfaces of the metal contacts 340A, 342 and the ILD layer 330A and in the top surfaces of the metal contacts 340B and the ILD layer 330B, the formations of the interconnects 350A and 350B are facilitated.

As shown in FIG. 19, for example, the interconnects 350A is formed on the metal contacts 340A, 342 and the ILD layer 330A and is electrically coupled to the transistor 320 through electrically connecting the metal contacts 340A, 342, and the interconnects 350B is formed on the metal contacts 340B and the ILD layer 330A and is electrically coupled to the transistor 320 through electrically connecting the metal contacts 340B. In some embodiments, the semiconductor device 30 has the front-side surface FS3 at the outmost surface of the interconnects 350A and the back-side surface BS3 at the outmost surface of the interconnects 350B. In the disclosure, for example, the metal contacts 340B and the interconnect 350B are together serve as a backside power rail of the transistor 320 in the semiconductor device 30. In some embodiments, as shown in FIG. 19, the backside power rail including the metal contacts 340B and the interconnect 350B is physically separated from the interconnect 350A. In other words, the backside power rail including the metal contacts 340B and the interconnect 350B is free from the interconnect 350A and the metal contact 340A. As shown in FIG. 19, the metal contacts 340B are not overlapped with the semiconductor substrate 310 along the directions X and Y, for example. In other words, the metal contacts 340B are free of the semiconductor substrate 310.

In some embodiments, the semiconductor device 30 further includes a plurality of connecting vias 360, where each of the connecting vias 360 includes a conductive via 362, isolation layer 364 and a cap layer 366. For example, as shown in FIG. 19, in the cross-sectional view of one connecting via 360, the isolation layer 364 is in form of a U-shape film having a recess therein, where the conductive via 362 and the cap layer 366 are located in the recess, and the conductive via 362 is located between the isolation layer 364 and the cap layer 366. For example, some of the connecting vias 360 are connected to some of the metal contacts 340A, as shown in FIG. 19. In some embodiments, the connecting vias 360 are adopted to establish an electrical connection between the transistor 320 and an external device (e.g. another transistor inside the semiconductor device 30 or inside another semiconductor device 30, a passive device inside the semiconductor device 30 or inside another semiconductor device 30, an external power/signal sources, or the like).

The connecting vias 360 are referred to as self-aligned vias and are formed prior to the formation of the gate structure 323, the spacer 324 and the S/D portions 325 and after the formation of the semiconductor fins 326 and the isolation regions, for example. In some embodiments, the connecting vias 360 are formed by, but not limited to, patterning the a plurality of recesses in the isolation regions formed in the semiconductor substrate 310, where the recesses extend along the extending direction of the semiconductor fins 326; sequentially forming the isolation layer 364, the conductive via 362 and the cap layer 366 in the recesses to form a plurality of the connecting vias 360. A material of the conductive vias 362 may include tungsten, cobalt, ruthenium, SiGeB, or other low resistivity material. In some embodiments, a width W1 of the conductive vias 362 is approximately ranging from 8 nm to 150 nm, and a height H362 of the conductive vias 362 is approximately ranging from 30 nm to 100 nm. A material of the isolation layer 364 may include SiO$_2$, SiN, SiCN, SiOCN, SiOC, or the like. In some embodiments, a width W2 of the isolation layer 364 is approximately ranging from 3 nm to 10 nm. The material of the isolation layer 364 may be the same or similar to the material of the isolation regions. A material of the cap layer 366 may include SiO$_2$, SiN, SiCN, SiOCN, SiOC, HfO$_2$, or the like. In some embodiments, a height H366 of the cap layer 366 is approximately ranging from 5 nm to 30 nm.

In addition, for example, the semiconductor device 30 further includes an etch stop layer 370 conformally formed on the transistors 320 and over the semiconductor substrate 310, where the etch stop layer 370 is located between the ILD layer 330A and the semiconductor substrate 310 and between the ILD layer 330A and the transistors 320. The etch stop layer 370 may cover at least a part of the transistors 320 exposed by the silicide layers 341A and 343 and the semiconductor substrate 310 and cover some of the connecting vias 360 not electrically connecting to the metal contacts 340A. For example, the etch stop layer 370 completely exposes the silicide layer 341A and 143 for connecting the metal contacts 340A and 342. Owing to the etch stop layer, the semiconductor substrate 310 and the transistors 320 are protected from damages caused by the fabrications of later-formed elements, such as the ILD layer 330A, the metals contacts 340A, 342, and the interconnects 350A. The etch stop layer 370 may be referred to as a contact etch stop layer (CESL). The formation and material of the etch stop layer 370 has been described in FIG. 1, and thus are not repeated herein.

In some embodiments, as shown in FIG. 19, the semiconductor device 40A includes a semiconductor substrate 410, at least one transistor 420, silicide layers 441A, 441B, 443, ILD layers 430A, 430B, metal contacts 440A, 440B, 442, the interconnects 450A, 450B, connecting vias 460 and an etch stop layer 470. In some embodiments, the transistor 420 includes a gate structure 423 (including a gate dielectric structure 421 and a gate electrode 422), a pair of spacers 424, S/D portions 425 (including 425(*n*) and 425(*p*)), and semiconductor fins 426. It should be noted that the details described above with respect to the elements of the semiconductor device 30 may also apply to the elements of the semiconductor device 40A, so the description of the elements in the semiconductor device 40A are omitted herein.

A shown in FIG. 19, for example, a sidewall of the carrier substrate 900 is substantially aligned with a sidewall of the bonding layer 910, a sidewall 10*sw* of the device layer 300, a sidewall of the device layer 400A and a sidewall of the passivation layer PV in the direction Z. In some embodiments, the forming process of the integrated circuit components 3000 is referred to as a Wafer-on-Wafer (WoW) process. Owing to the backside power rail (e.g., the metal contact 340B and the interconnect 350B of the device layer 300 and the metal contact 440B and the interconnect 450B of the device layer 400A), the signal loss in the power transmission to the integrated circuit component 3000 can be reduced, thereby enhancing the electrical performance of the integrated circuit component 3000.

FIG. 21 is a schematic cross-sectional view of an integrated circuit component in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 19 and FIG. 21, the integrated circuit component 3000 depicted in FIG. 19 and the integrated circuit component 4000 depicted in FIG. 21 are similar, a difference is that, for the integrated circuit component 4000 depicted in FIG. 21, besides the semiconductor device 40B is adopted to replace the semiconductor device 40A, the integrated circuit component 4000 further includes an insulating encapsulation 600, a plurality of conductive pillars 700 and a redistribution circuit structure 800. Referring to FIG. 21, in some embodiments, the integrated circuit component 4000 includes a carrier substrate 900, a bonding layer 910, a device layer 300 having at least one semiconductor device 30, a device layer 400B having at least one semiconductor device 40B, an insulating encapsulation 600 and conductive pillars 700, a redistribution circuit structure 800, a passivation layer PV and a plurality of conductive terminals 500.

In some embodiments, the bonding layer 910 is located on the carrier substrate 900, and the device layer 300 is located on the carrier substrate 900 by bonding to the bonding layer 910 through fusion bonding, where the bonding layer 910 is sandwiched between the carrier substrate 900 and the device layer 300. For example, a fusion bonding interface IF3 is presented at the interface of (e.g. a front-side surface FS3 of) the device layer 300 and (e.g. a surface S1 of) the bonding layer 910, as shown in FIG. 21. In some embodiments, the front-side surface FS3 of the device layer 300 is connected to the surface S1 of the bonding layer 910.

In some embodiments, the device layer 400B is located on the device layer 300, and the device layer 300 is located sandwiched between the bonding layer 910 and the device layer 400B, where the deice layer 400B is bonded to the device layer 300 through hybrid bonding. For example, a hybrid bonding interface IF4 is presented at the interface of (e.g. a back-side surface BS3 of) the device layer 300 and (e.g. a front-side surface FS4 of) the device layer 400B, as shown in FIG. 21. In some embodiments, the back-side surface BS3 of the device layer 300 is connected to the front-side surface FS4 of the device layer 400B. That is, the semiconductor device 40B included in the device layer 400B is boned to the semiconductor device 30 included in the device layer 300 in a manner of face-to-back configuration, for example. In some embodiments, the semiconductor device 40B included in the device layer 400B is boned to the semiconductor device 30 included in the device layer 300 are electrically connected to each other.

As shown in FIG. 21, the insulating encapsulation 600 laterally encapsulates the semiconductor device 40B and cover the back-side surface BS3 of the device layer 300, for example. In some embodiments, the conductive pillars 700 are arranged next to the semiconductor device 40B and penetrate through the insulating encapsulation 600 to connect to the interconnect 350B of the semiconductor device 30. For example, the conductive pillars 700 are electrically connected to the semiconductor device 30. As shown in FIG. 21, the redistribution circuit structure 800 is located over the device layer 400B (e.g. at a back-side surface BS4 thereof), where the redistribution circuit structure 800 is physically connected to the insulating encapsulation 600 and is physically and electrically connected to the semiconductor device 40B and the conductive pillars 700. In other word, the device layer 400B is located between the device layer 300 and the redistribution circuit structure 800.

In some embodiments, the passivation layer PV is located on the redistribution circuit structure 800, and the conductive terminals 500 are located on the passivation layer PV, where the redistribution circuit structure 800 is located between the device layer 400B and the passivation layer PV, and the passivation layer PV is located sandwiched between the redistribution circuit structure 800 and the conductive terminals 500. In some embodiments, the conductive terminals 500 are electrically connected to the semiconductor device 40B and the conductive pillars 700 included in the device layer 400B through the redistribution circuit structure 800. In some embodiments, the conductive terminals 500 are electrically connected to the semiconductor device 30 included in the device layer 300 through the semiconductor device 40B included in the device layer 400B and the redistribution circuit structure 800 and/or the conductive pillars 700 and the redistribution circuit structure 800. The details of the carrier substrate 900 and the bonding layer 910 have been previously described in FIG. 2, the details of the passivation layer PV and the conductive terminals 500 have been previously presented in FIG. 6, the details of the conductive pillars 700 and the redistribution circuit structure 800 have been previously presented in FIG. 16, and the details of the semiconductor device 30 has been previously presented in FIG. 19 and FIG. 20, and thus are not repeated herein. In addition, the details of the semiconductor device 40B is similar to or the same as the details of the semiconductor device 40A as previously described in the FIGS. 19 and 20, so the description of the elements in the semiconductor device 40B are omitted herein. In some embodiments, a sidewall of the carrier substrate 900 is substantially aligned with a sidewall of the bonding layer 910, a sidewall of the device layer 300, a sidewall of the device layer 400B (e.g. a sidewall of the insulating encapsulation 600) and a sidewall of the passivation layer PV in the direction Z. In some embodiments, the forming process of the integrated circuit components 4000 is referred to as a Chip-on-Wafer (CoW) process. Owing to the backside power rails (e.g., the metal contact 340B and the interconnect 350B of the device layer 300 and the metal contact 440B and the interconnect 450B of the device layer 400B), the signal loss in the power transmission to the integrated circuit component 4000 can be reduced, thereby enhancing the electrical performance of the integrated circuit component 4000.

For illustrative purposes, only one semiconductor device 30 is shown to be included in the device layer 300 and only one semiconductor device 40B is shown to be included in the device layer 400B, however the number of the semiconductor device 30 included in the device layer 300 and the number of the semiconductor device 40B included in the device layer 400B are not limited to the drawings of the disclosure, and may be one or more than one depending on the demand or design layout. The number of the semiconductor device 30 may be the same or different from the number of the semiconductor device 40B.

In addition, in a projection on the carrier substrate 900 along the direction Z, an occupying area of the semiconductor devices 30 may be the same as an occupying area of the semiconductor devices 40A and/or 40B. However, the disclosure is not limited thereto; alternatively, in the projection on the carrier substrate 900, an occupying area of the semiconductor devices 10 may be different from an occupying area of the semiconductor devices 40A and/or 40B.

In some embodiments, the integrated circuit components 1000, 2000, 3000 and 4000 each are referred to as a System-on-Integrated-Chips (SoIC). In some embodiments, only two device layers (e.g. 100/200A, 100/200B, 300/400A, or 300/400B) are shown in the integrated circuit components 1000, 2000, 3000 and 4000 for illustrative purposes, however the number of the device layers can be one, two or more, the disclosure is not limited thereto. The integrated circuit components 1000, 2000, 3000 and 4000 may be packaged with other semiconductor components/devices to form an integrated fan-out (InFO) package. In some embodiments, the integrated circuit components 1000, 2000, 3000 and 4000 may be may be further mounted with a circuit substrate, an interposer, an additional package, chips/dies or other electronic devices to form a package-on-package (PoP) structure or a stacked package structure such as a flip-chip (FC) package or a chip-on-wafer-on-substrate (CoWoS) package, through the conductive terminals 500.

Figure 22:
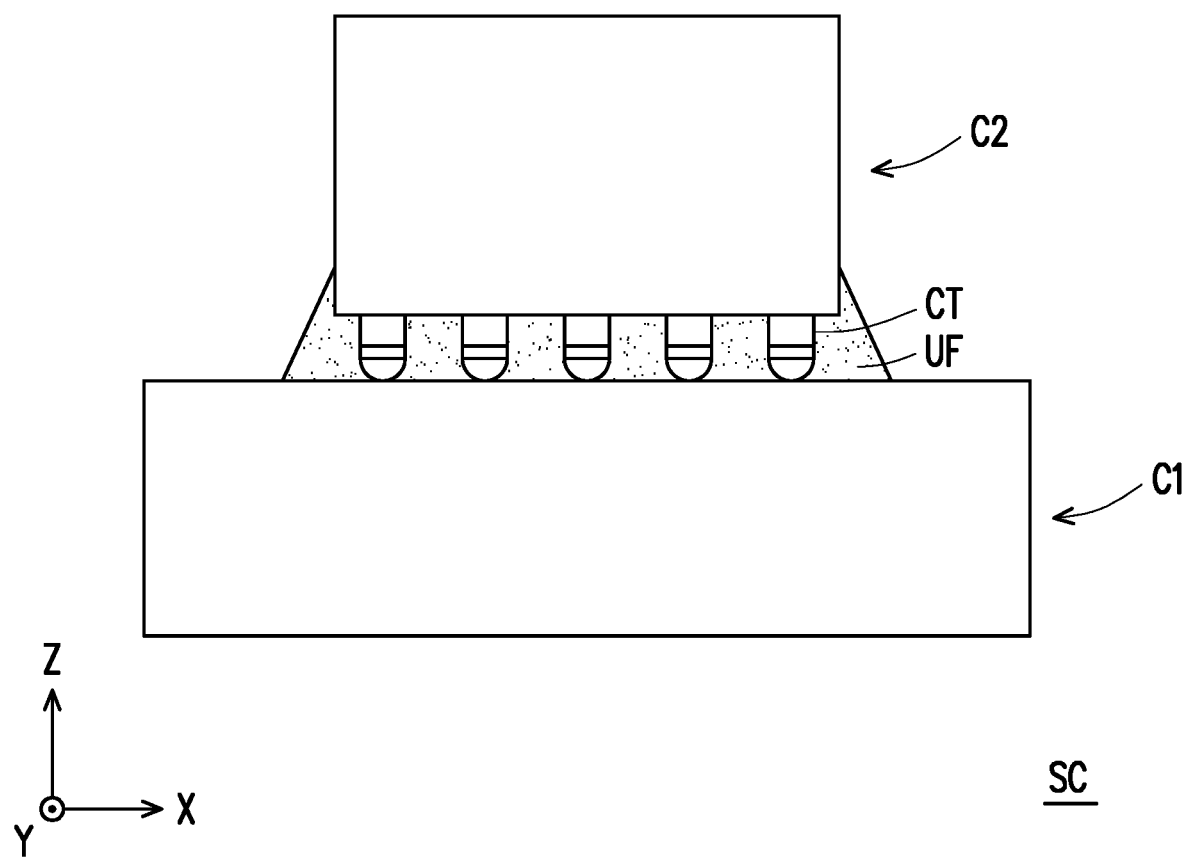
FIG. 22 is a schematic cross-sectional view of a semiconductor package in accordance with some embodiments of the disclosure.

FIG. 22 is a schematic cross-sectional view of a semiconductor package in accordance with some embodiments of the disclosure, where FIG. 22 illustrates the schematic cross-sectional view showing an application of an integrated circuit component in accordance with some embodiments of the disclosure. Like elements are designated with the same reference numbers for ease of understanding and the details thereof are not repeated herein. Referring to FIG. 22, a component assembly SC including a first component C1 and a second component C2 disposed over the first component C1 is provided. The first component C1 may be or may include an interposer, a package substrate, a printed circuit board (PCB), a printed wiring board, and/or other carrier that is capable of carrying integrated circuits. In some embodiments, the second component C2 mounted on the first component C1 is similar to one of the integrated circuit components 1000, 2000, 3000 and 4000 described above. For example, one or more integrated circuit components (e.g. 1000, 2000, 3000 and 4000) may be electrically coupled to the first component C1 through a plurality of terminals CT. The terminals CT may be the conductive terminals 500.

In some embodiments, an underfill layer UF is formed between the gap of the first component C1 and the second component C2 to at least laterally cover the terminals CT. Alternatively, the underfill layer UF is omitted. In one embodiment, the underfill UF may be formed by underfill dispensing or any other suitable method. In some embodiments, a material of the underfill UF may be the same or different from a material of the insulating encapsulation 600, the disclosure is not limited thereto. Owing to the underfill UF, a bonding strength between the first component C1 and the second component C2 is enhanced.

In some other embodiments, the second component C2 mounted on the first component C1 may be an integrated fan-out (InFO) package including at least one integrated circuit component (1000, 2000, 3000 and 4000 respectively described above in conjunction with FIG. 7, FIG. 17, FIG. 19 and FIG. 20) packaged therein. For example, the second component C2 includes a plurality of integrated circuit components (e.g., any combinations of integrated circuit components 1000, 2000, 3000 and 4000) disposed side by side and surrounding by a packaging encapsulation (not shown; e.g., a molding compound). The second component C2 may further include a fan-out redistribution structure (not shown) formed on the packaging encapsulation and these integrated circuit components laterally encapsulated by the packaging encapsulation, and the fan-out redistribution structure may be electrically coupled to these integrated circuit components. In such embodiments, the terminals CT may be controlled collapse chip connection (C4) bumps, ball grid array (BGA) bumps, other suitable terminals having the dimension greater than the conductive terminals of the integrated circuit components, and/or the like. For example, the terminals CT are formed on the fan-out redistribution structure to be electrically coupled to the first component C1, and these integrated circuit components are electrically coupled to the terminals CT through the fan-out redistribution structure.

Other packaging techniques may be used to form the component assembly SC, which are not limited in the disclosure. For example, the component assembly SC is formed using a wafer level packaging (WLP), a CoWoS process, a chip-on-chip-on-substrate (CoCoS) process, etc. The component assembly SC may be a part of an electronic system for such as computers (e.g., high-performance computer), computational devices used in conjunction with an artificial intelligence system, wireless communication devices, computer-related peripherals, entertainment devices, etc. The component assembly SC including the integrated circuit component(s) discussed herein may provide high bandwidth data communication. It should be noted that other electronic applications are also possible. Alternatively, an additional terminal may be physical and electrical contact with first component C1 opposite to the terminals CT for electrical connection to any other external component(s).

In accordance with some embodiments, a semiconductor device includes a gate structure, source/drain (S/D) elements, a first metallization contact and a second metallization contact. The S/D elements are respectively located at two different sides of the gate structure. The first metallization contact is located at and in contact with a first side of each of the S/D elements. The second metallization contact is located at and in contact with a second side of each of the S/D elements, where the semiconductor device is configured to receive a power signal through the second metallization contact. The first side is opposite to the second side along a stacking direction of the gate structure and the S/D elements, and the first side is closer to the gate structure than the second side is.

In accordance with some embodiments, a semiconductor device includes a semiconductor substrate, a gate stack, source and drain (S/D) regions, first metal contacts and second metal contacts. The semiconductor substrate has a first side and a second side opposite to the first side. The gate stack is located on the first side of the semiconductor substrate. The S/D portions are located inside the semiconductor substrate and at two opposite sides of the gate stack. The first metal contacts are located over the first side of the semiconductor substrate and respectively electrically coupled to the S/D portions. The second metal contacts are located over the second side of the semiconductor substrate and respectively in contact with the S/D portions, where the second meal contacts are distant from the first side of the semiconductor substrate. The second metal contacts are configured to electrically couple the semiconductor device to a power.

In accordance with some embodiments, a method of manufacturing a semiconductor device includes the following steps: providing a first device layer, the first device layer comprising a first semiconductor device, wherein the first semiconductor device comprises a first gate structure, first source/drain (S/D) elements respectively located at two different sides of the first gate structure, a first conductive contact and a second conductive contact respectively located at and in contact with at two different sides of each of the first S/D elements; providing a substrate and disposing the first device layer on the substrate; disposing a second device layer on the first device layer, the second device layer comprising a second semiconductor device, wherein the second semiconductor device comprises a second gate structure, second S/D elements respectively located at two different sides of the second gate structure, a third conductive contact and a fourth conductive contact located at and in contact with at two different sides of each of the second S/D elements; bonding the second device layer to the first device layer in a manner of face-to-back configuration; and forming a plurality of conductive terminals over the second device layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a gate structure;
   source/drain (S/D) elements, respectively located at two different sides of the gate structure;
   a first metallization contact, located at a first side of each of the S/D elements and electrically connected to the each of the S/D elements through a first silicide layer physically contacting the first metallization contact and the each of the S/D elements with two opposite sides thereof; and
   a second metallization contact, located at a second side of each of the S/D elements and electrically connected to the each of the S/D elements through a second silicide layer physically contacting the second metallization contact and the each of the S/D elements with two opposite sides thereof, wherein the semiconductor device is configured to receive a power signal through the second metallization contact,
   wherein the first side is opposite to the second side along a stacking direction of the gate structure and the S/D elements, and the first side is closer to the gate structure than the second side is.

2. The semiconductor device of claim 1, wherein:
   the S/D elements and the gate structure are arranged along a first direction, and
   each of the S/D elements and the first metallization contact and the second metallization contact respectively located at the first side and the second side thereof are arranged along the stacking direction, and the first direction is different from the stacking direction.

3. The semiconductor device of claim 1, further comprising:
   a semiconductor substrate, having a first surface and a second surface opposite to the first surface;
   a semiconductor fin, located between the S/D elements and partially underneath the gate structure, the semiconductor fin being located on the semiconductor substrate; and
   a channel, located in the semiconductor fin and between the S/D elements and under the gate structure, wherein:
      the semiconductor fin is located on and protruded away from the first surface of the semiconductor substrate;
      the S/D elements are at least partially embedded in the semiconductor substrate, wherein the first side of each of the S/D elements protrudes away from the first surface of the semiconductor substrate, and the second side of each of the S/D elements is exposed by the second surface of the semiconductor substrate;
      the first metallization contact is located over the first surface of the semiconductor substrate and in contact with the first side of each of the S/D elements through the first silicide layer; and
      the second metallization contact is located over the second surface of the semiconductor substrate and in contact with the second side of each of the S/D elements through the second silicide layer.

4. The semiconductor device of claim 3, the first metallization contact and the second metallization contact are aside of the semiconductor substrate along the stacking direction, and the first metallization contact and the second metallization contact are free of the semiconductor substrate.

5. The semiconductor device of claim 1, further comprising:
a first interconnect, located over and electrically connected to the first metallization contact;
a second interconnect, located over and electrically connected to the second metallization contact, wherein the gate structure, the S/D elements, the first metallization contact and the second first metallization contact are located between the first interconnect and the second interconnect;
a first inter-level dielectric layer, located between the first interconnect and the S/D elements, the first metallization contact connecting the first interconnect and a respective one of the S/D elements via penetrating through the first inter-level dielectric layer; and
a second inter-level dielectric layer, located between the second interconnect and the S/D elements, the second metallization contact connecting the second interconnect and the respective one of the S/D elements via penetrating through the second inter-level dielectric layer,
wherein the semiconductor device has a frontside surface comprising an outermost surface of the first interconnect facing away from the second interconnect and a backside surface comprising an outermost surface of the second interconnect facing away from the first interconnect.

6. The semiconductor device of claim 5, wherein the first metallization contact and the second metallization contact independently comprise a conductive via having two contact surfaces and a sidewall connecting the two contact surfaces, wherein:
the first metallization contact is electrically connected to the first interconnect and the respective one of the S/D elements through the two contact surfaces of the first metallization contact, respectively;
the second metallization contact is electrically connected to the second interconnect and the respective one of the S/D elements through the two contact surfaces of the second metallization contact, respectively;
the sidewall of the first metallization layer is covered by the first inter-level dielectric layer; and
the sidewall of the second metallization layer is covered by the second inter-level dielectric layer.

7. An integrated circuit component, comprising:
a first device layer comprising a plurality of first semiconductor devices each comprising a semiconductor device as claimed in claim 1;
a second device layer comprising a plurality of second semiconductor devices each comprising a semiconductor device as claimed in claim 1, wherein the second device layer is connected to the first device layer in a manner of a face-to-back configuration;
a substrate, located on the first device layer, the first device layer being located between the substrate and the second device layer; and
a plurality of conductive terminals, located on the second device layer, and the second device layer being located between the first device layer and the plurality of conductive terminals,
wherein the plurality of conductive terminals are electrically coupled to the plurality of first semiconductor devices through the plurality of second semiconductor devices.

8. The integrated circuit component of claim 7, wherein the plurality of first semiconductor devices comprised in the first device layer are interconnected into a wafer-form, and the plurality of second semiconductor devices comprised in the second device layer are interconnected into a wafer-form,
wherein a sidewall of the second device layer is substantially aligned with a sidewall of the first device layer and a sidewall of the substrate.

9. The integrated circuit component of claim 7, wherein the plurality of first semiconductor devices comprised in the first device layer are interconnected into a wafer-form, and the plurality of second semiconductor devices comprised in the second device layer are separated from each other,
wherein second interconnects of the plurality of second semiconductor devices together comprises a common interconnect, and the integrated circuit component further comprises:
an insulating encapsulation, laterally encapsulating the plurality of second semiconductor devices comprised in the second device layer, the insulating encapsulation being located between the first device layer and the common interconnect, and the common interconnect extending over the insulating encapsulation and the plurality of second semiconductor devices comprised in the second device layer; and
a plurality of through vias, penetrating the insulating encapsulation and arranged aside of the plurality of second semiconductor devices, wherein the plurality of through vias are connected to the first device layer and the common interconnect, wherein the plurality of conductive terminals are electrically coupled to the plurality of first semiconductor devices through the plurality of through vias, and the plurality of conductive terminals are electrically coupled to the plurality of second semiconductor devices through the common interconnect.

10. The integrated circuit component of claim 9, wherein a sidewall of the insulating encapsulation is substantially aligned with a sidewall of the common interconnect, a sidewall of the first device layer and a sidewall of the substrate.

11. A semiconductor device, comprising:
a semiconductor substrate, having a first side and a second side opposite to the first side;
a gate stack, located on the first side of the semiconductor substrate;
source and drain (S/D) regions, located inside the semiconductor substrate and at two opposite sides of the gate stack;
first metal contacts, located over the first side of the semiconductor substrate and respectively electrically coupled to the S/D regions through silicide portions, wherein the silicide portions physically contact the S/D regions and the first metal contacts; and
second metal contacts, located over the second side of the semiconductor substrate and respectively electrically coupled to the S/D regions through the silicide portions, wherein the silicide portions physically contact the S/D regions and the second metal contacts, wherein the second metal contacts are distant from the first side of the semiconductor substrate, wherein the second metal contacts are configured to electrically couple the semiconductor device to a power.

12. The semiconductor device of claim 11, wherein:
the silicide portions each are located at a surface of each of the S/D regions exposed by the first surface of the semiconductor substrate and electrically coupled to the S/D regions, wherein the silicide portion each have a first side and a second side opposite to the first side along a stacking direction of the semiconductor substrate and the gate stack, wherein:
the first metal contacts are in electric contact with the S/D regions through connecting the first metal contacts with the first sides; and
the second metal contacts are in electric contact with the S/D regions through connecting the second metal contacts with the second sides.

13. The semiconductor device of claim 11, wherein the second metal contacts connected to the second sides of the silicide portions by passing through a part of the semiconductor substrate and penetrating through the S/D regions.

14. The semiconductor device of claim 11, further comprising:
a first interconnect, located over and electrically connected to the first metal contacts;
a second interconnect, located over and electrically connected to the second metal contacts, wherein the gate stack, the semiconductor substrate, the first metal contacts and the second metal contacts are located between the first interconnect and the second interconnect;
a first inter-level dielectric layer, located between the first interconnect and the semiconductor substrate, the first metal contacts connecting the first interconnect and the S/D regions by penetrating the first inter-level dielectric layer; and
a second inter-level dielectric layer, located between the second interconnect and the semiconductor substrate, the second metal contacts connecting the second interconnect and the S/D regions by penetrating the second inter-level dielectric layer,
wherein the semiconductor device has a frontside surface comprising an outermost surface of the first interconnect facing away from the second interconnect and a backside surface comprising an outermost surface of the second interconnect facing away from the first interconnect.

15. An integrated circuit component, comprising:
a first device layer comprising a plurality of first semiconductor devices each comprising a semiconductor device as claimed in claim 11;
a second device layer comprising a plurality of second semiconductor devices each comprising a semiconductor device as claimed in claim 11, wherein the second device layer is connected to the first device layer in a manner of a face-to-back configuration;
a substrate, located on the first device layer, the first device layer being located between the substrate and the second device layer; and
a plurality of conductive terminals, located on the second device layer, and the second device layer being located between the first device layer and the plurality of conductive terminals,
wherein the plurality of conductive terminals are electrically coupled to the plurality of first semiconductor devices through the plurality of second semiconductor devices.

16. The integrated circuit component of claim 15, wherein the plurality of first semiconductor devices comprised in the first device layer are interconnected into a wafer-form, and the plurality of second semiconductor devices comprised in the second device layer are interconnected into a wafer-form,
wherein a sidewall of the second device layer is substantially aligned with a sidewall of the first device layer and a sidewall of the substrate.

17. The integrated circuit component of claim 15, wherein the plurality of first semiconductor devices comprised in the first device layer are interconnected into a wafer-form, and the plurality of second semiconductor devices comprised in the second device layer are separated from each other,
wherein second interconnects of the plurality of second semiconductor devices together comprises a common interconnect, and the integrated circuit component further comprises:
an insulating encapsulation, laterally encapsulating the plurality of second semiconductor devices comprised in the second device layer, the insulating encapsulation being located between the first device layer and the common interconnect, and the common interconnect extending over the insulating encapsulation and the plurality of second semiconductor devices comprised in the second device layer; and
a plurality of through vias, penetrating the insulating encapsulation and arranged aside of the plurality of second semiconductor devices, wherein the plurality of through vias are connected to the first device layer and the common interconnect, wherein the plurality of conductive terminals are electrically coupled to the plurality of first semiconductor devices through the plurality of through vias, and the plurality of conductive terminals are electrically coupled to the plurality of second semiconductor devices through the common interconnect,
wherein a sidewall of the insulating encapsulation is substantially aligned with a sidewall of the common interconnect, a sidewall of the first device layer and a sidewall of the substrate.

18. A method of manufacturing an integrated circuit component, comprising:
providing a first device layer, the first device layer comprising a first semiconductor device, wherein the first semiconductor device comprises a first gate structure, first source/drain (S/D) elements respectively located at two different sides of the first gate structure, and a first conductive contact and a second conductive contact respectively located at two different sides of each of the first S/D elements, wherein the first conductive contact is electrically connected to the each of the first S/D elements through a first silicide layer physically contacting the first conductive contact and the each of the first S/D elements with two opposite sides thereof, and the second conductive contact is electrically connected to the each of the first S/D elements through a second silicide layer physically contacting the second conductive contact and the each of the first S/D elements with two opposite sides thereof;
providing a substrate and disposing the first device layer on the substrate;
disposing a second device layer on the first device layer, the second device layer comprising a second semiconductor device, wherein the second semiconductor device comprises a second gate structure, second S/D elements respectively located at two different sides of the second gate structure, and a third conductive contact and a fourth conductive contact located at two different sides of each of the second S/D elements, wherein the third conductive contact is electrically connected to the each of the second S/D elements through a third silicide layer physically contacting the third conductive contact and the each of the second S/D elements with two opposite sides thereof, and the fourth conductive contact is electrically connected to the each of the second S/D elements through a fourth silicide layer physically contacting the fourth conductive contact and the each of the second S/D elements with two opposite sides thereof;

bonding the second device layer to the first device layer in a manner of face-to-back configuration; and forming a plurality of conductive terminals over the second device layer.

19. The method of claim 18, wherein the second semiconductor device comprised in the second device layer comprises a plurality of separated and independent second semiconductor devices, and after bonding the second device layer to the first device layer and prior to forming the plurality of conductive terminals over the second device layer, the method further comprises:

encapsulating the plurality of separated and independent second semiconductor devices in an insulating encapsulation; and forming a plurality of through vias penetrating through the insulating encapsulation and electrically connected to the first device layer, wherein forming the plurality of through vias further comprises forming one of the third conductive contact and the fourth conductive contact being away from the first device layer than other one of the third conductive contact and the fourth conductive contact is.

20. The method of claim 18, wherein bonding the second device layer to the first device layer comprises performing a hybrid bonding process to bond the second device layer to the first device layer.

* * * * *